(12) United States Patent
Winkler et al.

(10) Patent No.: US 8,699,000 B2
(45) Date of Patent: Apr. 15, 2014

(54) ILLUMINATION SYSTEM FOR A LITHOGRAPHIC APPARATUS

(75) Inventors: Steffen Winkler, Eindhoven (NL); Marco Matheus Louis Steeghs, Sevenum (NL)

(73) Assignee: ASML Netherlands B.V., Veldhoven (NL)

( * ) Notice: Subject to any disclaimer, the term of this patent is extended or adjusted under 35 U.S.C. 154(b) by 337 days.

(21) Appl. No.: 13/275,733

(22) Filed: Oct. 18, 2011

(65) Prior Publication Data
US 2012/0162624 A1 Jun. 28, 2012

Related U.S. Application Data

(60) Provisional application No. 61/426,812, filed on Dec. 23, 2010.

(51) Int. Cl.
*G03B 27/54* (2006.01)
*G03B 27/72* (2006.01)
(52) U.S. Cl.
USPC .............................................. 355/67; 355/71
(58) Field of Classification Search
USPC .................. 355/53, 67–71; 359/634
See application file for complete search history.

(56) References Cited

U.S. PATENT DOCUMENTS

| | | | |
|---|---|---|---|
| 2,186,203 A | 1/1940 | Centeno | |
| 3,538,335 A | 11/1970 | Tartanian | |
| 4,290,473 A | 9/1981 | Pierson et al. | |
| 5,107,529 A | 4/1992 | Boone | |
| 5,204,773 A | 4/1993 | Guida | |
| 5,210,657 A | 5/1993 | Komazawa et al. | |
| 5,515,119 A | 5/1996 | Murdock et al. | |
| 7,260,183 B2 | 8/2007 | Yuan et al. | |
| 7,272,208 B2 | 9/2007 | Yatsenko et al. | |
| 7,440,205 B2 | 10/2008 | Malfait et al. | |
| 2006/0146413 A1 * | 7/2006 | Klunder et al. | 359/634 |
| 2008/0030707 A1 | 2/2008 | Tanaka et al. | |
| 2010/0328639 A1 * | 12/2010 | Jak et al. | 355/71 |

FOREIGN PATENT DOCUMENTS

| | | |
|---|---|---|
| GB | 2 339 920 A | 2/2000 |
| WO | WO 01/81974 A1 | 11/2001 |

* cited by examiner

*Primary Examiner* — Hung Henry Nguyen
(74) *Attorney, Agent, or Firm* — Sterne, Kessler, Goldstein & Fox P.L.L.C.

(57) ABSTRACT

An illumination system for a lithographic apparatus comprises a radiation intensity filter for controlling the intensity distribution of a beam of radiation travelling along an optical axis (Z), the radiation intensity filter comprising a first member and a second member. Each of the first and second members comprise a plurality of opaque regions which are substantially opaque to the radiation beam. The first member and second member are moveable relative to one another between a first relative position and a second relative position. In the first relative position at least a portion of one of the opaque regions of the first member overlaps in the direction of the optical axis with a portion of one of the opaque regions of the second member. In the second relative position the total area of overlap in the direction of the optical axis of the opaque regions of the first member with the opaque regions of the second member is less than that in the first relative position.

20 Claims, 17 Drawing Sheets

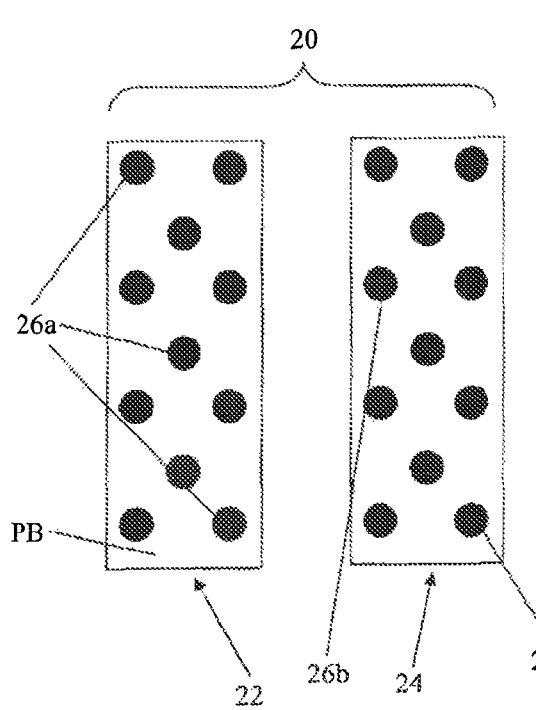
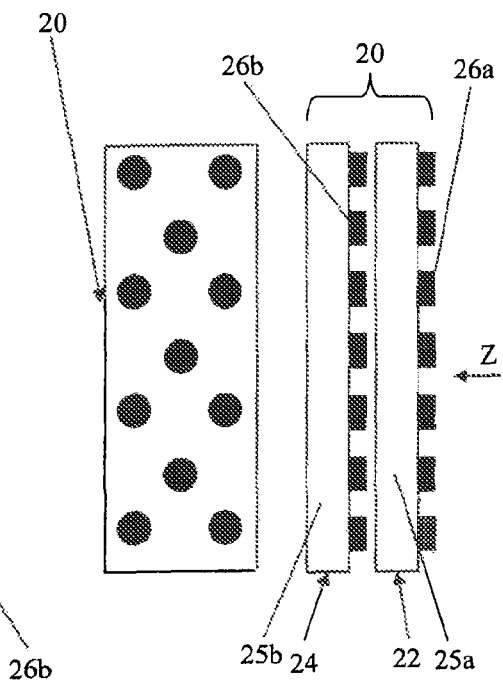
Figure 3a
Figure 3b
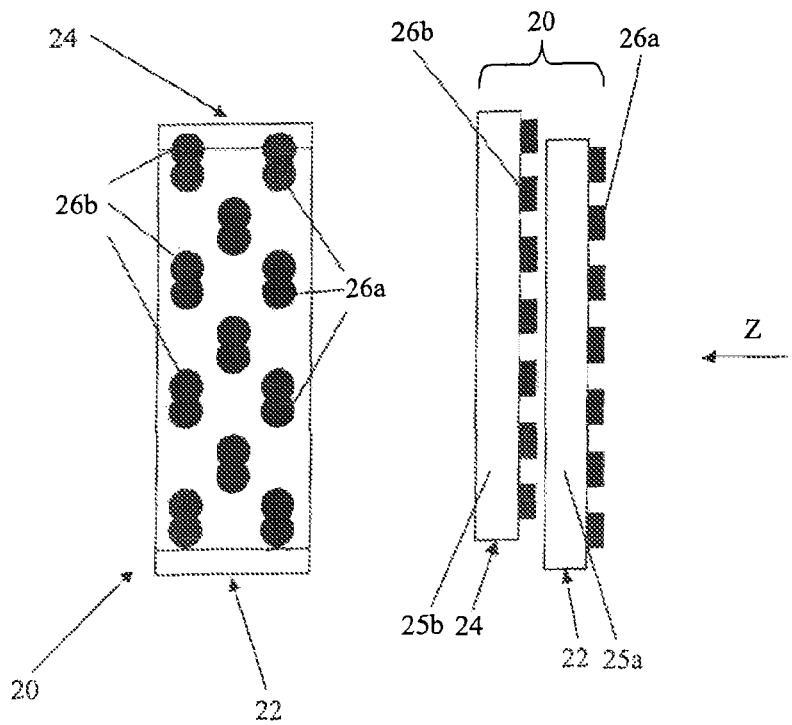
Figure 4

US 8,699,000 B2

ILLUMINATION SYSTEM FOR A LITHOGRAPHIC APPARATUS

CROSS REFERENCE TO RELATED APPLICATIONS

This application claims the benefit under 35 U.S.C. 119(e) to U.S. Provisional Patent Application 61/426,812, filed Dec. 23, 2010, which is incorporated by reference herein in its entirety.

FIELD

The present invention relates to a lithographic apparatus, an illumination system for a lithographic apparatus and a method of modifying the intensity of a radiation beam within a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction the "scanning"-direction) while synchronously scanning the substrate parallel or anti parallel to this direction.

Known lithographic apparatus has a radiation source that produces radiation and an illumination system which conditions the radiation produced by the radiation source and directs a conditioned beam of radiation towards the patterning device. Some illumination systems have an illumination mode control arrangement that is capable of modifying the radiation beam to produce different illumination modes of the radiation beam. Each illumination mode of the radiation beam may have different characteristics, for example, angular intensity distribution and/or spatial intensity distribution. Each illumination mode may have a different angular intensity distribution in a pupil plane and a different spatial intensity distribution in a field plane. The illuminator may also have a uniformity control apparatus which selectively blocks parts of the radiation beam to control the uniformity of the radiation beam which is directed at the patterning device and hence the substrate. In some lithographic apparatus the uniformity control apparatus is used to make the scan-integrated intensity of the beam of radiation in the field plane (i.e., the spatial intensity distribution) as uniform as possible. The uniformity control apparatus may be in a plane which is not a field plane such that, by blocking parts of the radiation beam, it affects both the angular intensity distribution in a pupil plane as well as the spatial intensity distribution in a field plane. The substrate may be located in a field plane. In this case, if the spatial intensity distribution in the field plane is adversely affected by the uniformity control apparatus, then the imaging performance of the lithographic apparatus may also be negatively affected.

In some lithographic apparatus, a fixed grey filter is used to compensate for the change in the spatial intensity distribution in the field plane caused by the uniformity control apparatus. The fixed grey filter is configured such that it compensates for the change in the spatial intensity distribution in the field plane caused by the uniformity control apparatus for a particular illumination mode of the radiation beam produced by the illumination mode control arrangement. If the illumination mode of the radiation beam produced by the illumination mode control arrangement is changed, then the fixed grey filter will no longer be optimised to compensate for the change in the spatial intensity distribution in the field plane caused by the uniformity control apparatus. In this situation, because the fixed grey filter is not optimised to compensate for the change in the spatial intensity distribution in the field plane caused by the uniformity control apparatus, a reduction in the imaging performance of the lithographic apparatus may be caused. It is undesirable to remove the fixed grey filter and replace it with a fixed grey filter which is optimised for the new illumination mode, because to do so may be a time consuming and complicated procedure. Such a replacement of the fixed grey filter may therefore adversely affect the throughput (or production rate) of the lithographic apparatus. Furthermore, it may be impractical to have an optimised grey filter for every illumination mode of the lithographic apparatus.

SUMMARY

It is desirable to provide, for example, a grey filter with a locally controllable transmission ratio to obviate or mitigate one or more of the problems of the prior art, whether identified herein or elsewhere.

According to an aspect of the present invention, there is provided an illumination system for a lithographic apparatus comprising a radiation intensity filter for controlling the intensity distribution of a beam of radiation travelling along an optical axis, the radiation intensity filter comprising a first member and a second member, each of the first and second members comprising a plurality of opaque regions which are substantially opaque to the radiation beam, wherein the first member and second member are moveable relative to one another between a first relative position and a second relative position, wherein in the first relative position at least a portion of one of the opaque regions of the first member overlaps in the direction of the optical axis with a portion of one of the opaque regions of the second member, and in the second relative position the total area of overlap in the direction of the optical axis of the opaque regions of the first member with the opaque regions of the second member is less than that in the first relative position.

The use of a radiation intensity filter according to the present invention allows the intensity distribution of the radiation beam to be controlled. This may include controlling the spatial intensity distribution of the radiation beam in a field plane and/or controlling the angular intensity distribution of the radiation beam in a pupil plane. The spatial intensity of the radiation beam may be controlled such that its uniformity in the field plane is maximised. Furthermore, the angular distribution of the radiation beam in the field plane may be controlled such that it is within desired parameters. In order to control the intensity distribution of the radiation beam (in the field plane and/or pupil plane), the radiation intensity filter allows the intensity distribution of the radiation beam passing through it to be controlled such that the radiation intensity filter may compensate, at least in part, for any unwanted effects on the radiation intensity distribution (in the field plane and/or pupil plane) of the radiation beam caused by a uniformity control apparatus and/or the illumination mode of the radiation beam.

According to another aspect of the present invention, there is provided an illumination system for a lithographic apparatus comprising a radiation intensity filter for controlling the intensity distribution of a beam of radiation travelling along an optical axis, the radiation intensity filter comprising a first member and a plurality of second members, each of the first and second members comprising a plurality of opaque regions which are substantially opaque to the radiation beam, wherein each of the second members are independently moveable relative to the first member between a first relative position and a second relative position, wherein in the first relative position at least a portion of one of the opaque regions of the first member overlaps in the direction of the optical axis with a portion of one of the opaque regions of the second member, and in the second relative position the total area of overlap in the direction of the optical axis of the opaque regions of the first member with the opaque regions of the second member is less than that in the first relative position.

According to a further aspect of the present invention, there is provided an illumination system for a lithographic apparatus comprising a radiation intensity filter for controlling the intensity distribution of a beam of radiation travelling along an optical axis, the radiation intensity filter comprising a first member, a second member and an intermediate member, at least part of which is located between the first member and the second member, each of the first, second and intermediate members comprising a plurality of opaque regions which are substantially opaque to the radiation beam, wherein the intermediate member and the second member are independently moveable relative to the first member and relative to one another between a first configuration and a second and second configuration, wherein in the first configuration at least a portion of one of the opaque regions of the first member overlaps in the direction of the optical axis with a portion of one of the opaque regions of the second member and/or intermediate member, and/or at least a portion of one of the opaque regions of the intermediate member overlaps in the direction of the optical axis with a portion of one of the opaque regions of the second member, and in the second configuration the total area of overlap in the direction of the optical axis of the opaque regions of the first member with the opaque regions of the second member and/or intermediate member, and/or of the opaque regions of the intermediate member with the opaque regions of the second member, is less than that in the first relative position.

According to a still further aspect of the present invention, there is provided a lithographic apparatus comprising an illumination system for providing a beam of radiation along an optical axis, a support structure for supporting patterning device, the patterning device serving to impart the radiation beam with a pattern in its cross-section, a substrate table for holding a substrate, and a projection system for projecting the patterned radiation beam onto a target portion of the substrate, wherein the illumination system comprises a radiation intensity filter for controlling the intensity distribution of the beam of radiation, the radiation intensity filter comprising a first member and a second member, each of the first and second members comprising a plurality of opaque regions which are substantially opaque to the radiation beam, wherein the first member and second member are moveable relative to one another between a first relative position and a second relative position, wherein in the first relative position at least a portion of one of the opaque regions of the first member overlaps in the direction of the optical axis with a portion of one of the opaque regions of the second member, and in the second relative position the total area of overlap in the direction of the optical axis of the opaque regions of the first member with the opaque regions of the second member is less than that in the first relative position.

According to a yet further aspect of the present invention, there is provided a method of modifying the intensity distribution of a radiation beam within a lithographic apparatus comprising: providing a beam of radiation using an illumination system, providing a radiation intensity filter, the radiation intensity filter comprising a first member and a second member, each of the first and second members comprising a plurality of opaque regions which are substantially opaque to the radiation beam, passing the beam of radiation through the radiation intensity filter along an optical axis, and modifying the intensity of the beam of radiation by moving the first member and second member relative to one another between a first relative position and a second relative position, wherein in the first relative position at least a portion of one of the opaque regions of the first member overlaps in the direction of the optical axis with a portion of one of the opaque regions of the second member, and in the second relative position the total area of overlap in the direction of the optical axis of the opaque regions of the first member with the opaque regions of the second member is less than that in the first relative position, thereby the opaque regions of the first and second members blocking a greater proportion of the radiation beam passing through the radiation intensity filter in the second relative position compared to the first relative position.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIGS. 3a, 3b and 4 depict a radiation intensity filter in accordance with a first embodiment of the present invention.

Figure 1:
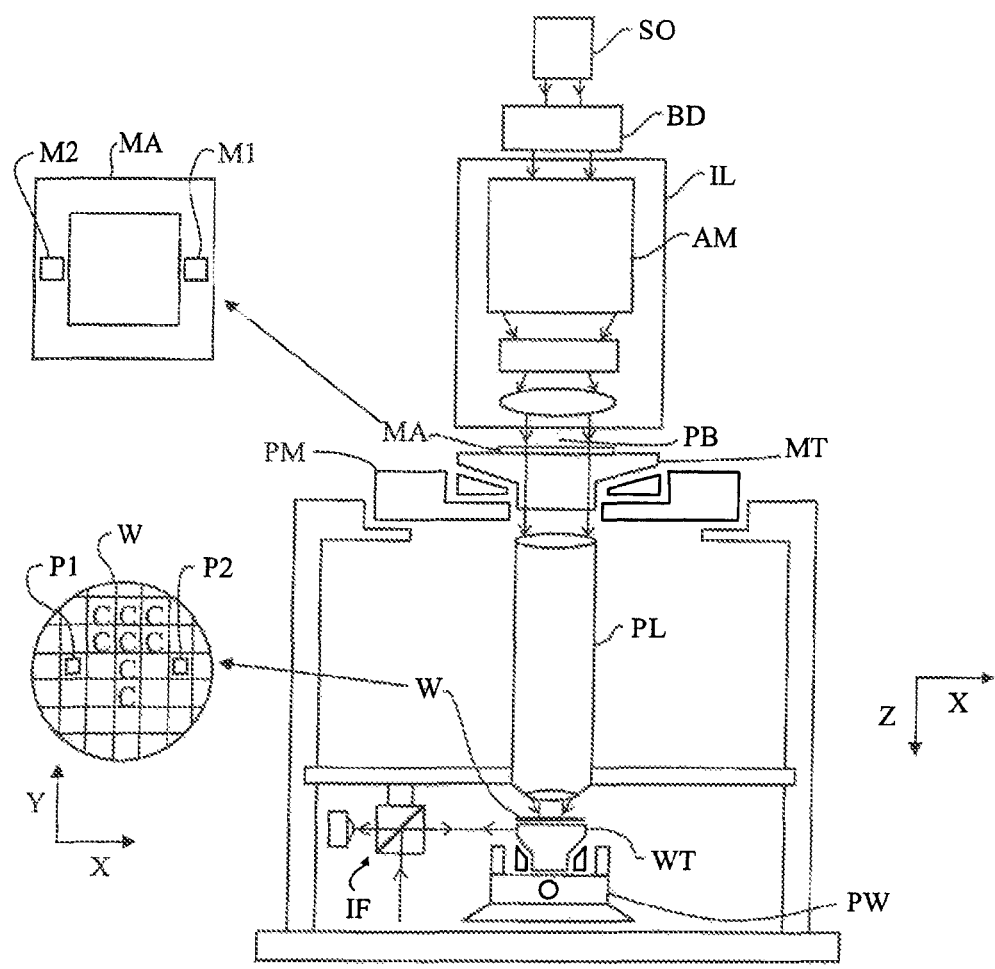
FIG. 1 depicts a lithographic apparatus.

FIGS. 21, 22, 23, and 24 depict a radiation intensity filter in accordance with a tenth embodiment of the present invention and corresponding graphs.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a tack (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

FIG. 1 schematically depicts an optical lithographic apparatus according to a particular embodiment of the present invention. The apparatus comprises an illumination system (illuminator) IL to condition a beam PB of radiation (e.g., DUV radiation), a support structure (e.g., a support structure) MT to support a patterning device (e.g., a mask) MA and connected to first positioning device PM to accurately position the patterning device with respect to item PL, a substrate table (e.g., a wafer table) WT for holding a substrate (e.g., a resist coated wafer) W and connected to second positioning device PW for accurately positioning the substrate with respect to item PL, and a projection system (e.g., a refractive projection lens) PL configured to image a pattern imparted to the radiation beam PB by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to for part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as □-outer and □-inner, respectively) of the intensity distribution in a pupil plane of the illuminator can be adjusted. The illuminator provides a conditioned beam of radiation PB, having a desired uniformity and intensity distribution in its cross section. The conditioned beam PB and radiation passing through the illuminator travels along an optical axis, the direction of which is indicated within FIG. 1 by directional arrow Z.

The radiation beam PB is incident on the patterning device (e.g., mask) MA, which is held on the support structure MT. Having traversed the patterning device MA, the beam PB passes through the lens PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam PB. Similarly, the first positioning device PM and another position sensor (which is not explicitly depicted in FIG. 1) can be used to accurately position the patterning device MA with respect to the path of the beam PB, e.g., after mechanical retrieval from a mask library, or during a scan. In general, movement of the object tables MT and WT will be realized with the aid of a long-stroke module (coarse positioning) and a short-stroke module (fire positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e., a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
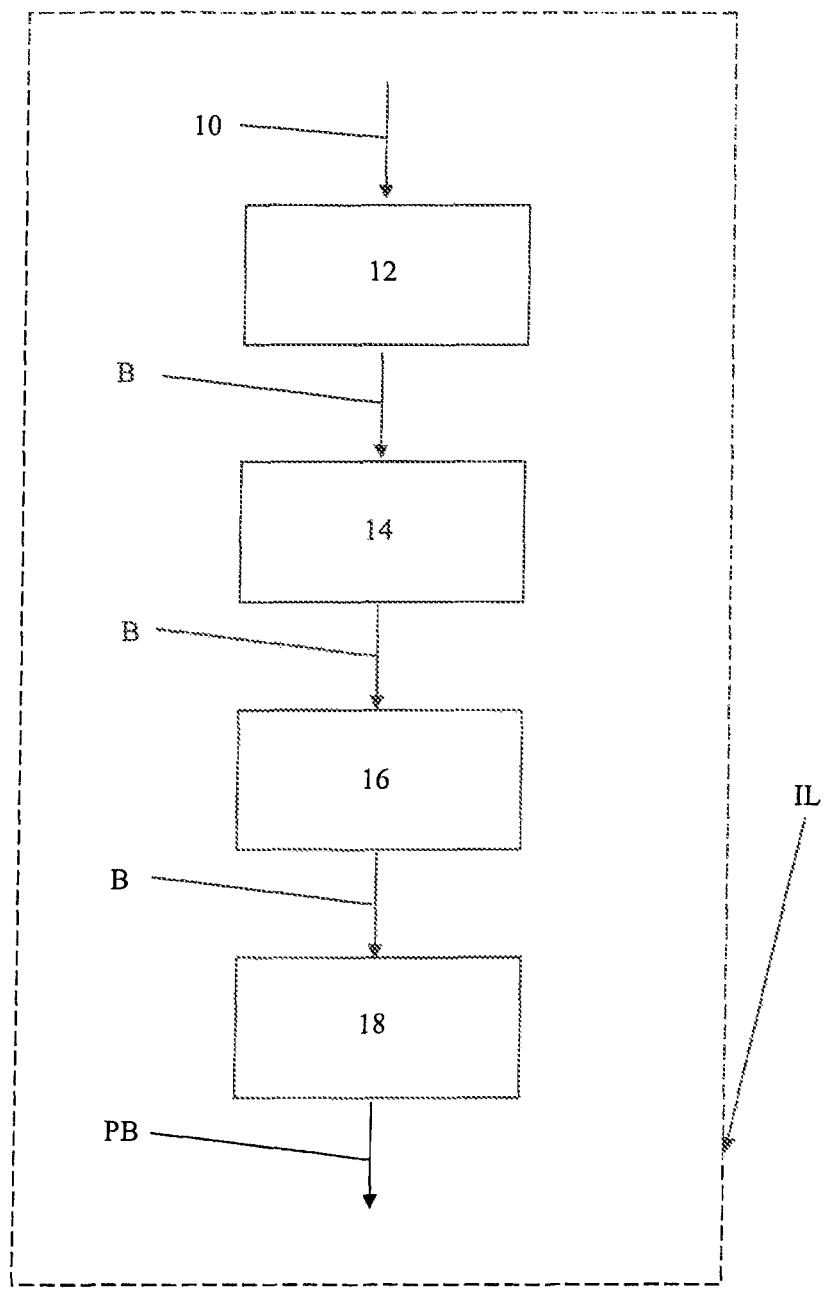
FIG. 2 depicts a schematic diagram of a portion of an illumination system which forms part of the lithographic apparatus shown in FIG. 1.

FIG. 2 shows a schematic layout of an illuminator IL which may form part of the lithographic apparatus shown in FIG. 1. The illuminator receives radiation (indicated by arrow 10)

from the source (not shown in FIG. 2). The radiation from the source forms a beam of radiation B which passes through an illumination mode control arrangement 12 which is capable of modifying the radiation beam B to produce different illumination modes of the radiation beam B. Each illumination mode of the radiation beam may have different characteristics, such as, angular intensity distribution and/or spatial intensity distribution. For example, each illumination mode may have a different angular intensity distribution in a pupil plane and a different spatial intensity distribution in a field plane.

The illuminator IL also has a uniformity control apparatus 14 which is downstream of the illumination mode control arrangement 12 and which may selectively block parts of the radiation beam B to control the uniformity of the conditioned radiation beam PB which is output from the illuminator IL and which is directed at the patterning device (not shown in FIG. 2) and hence the substrate (also not shown in FIG. 2). The uniformity control apparatus 14 may be in a near-field plane such that, by blocking parts of the radiation beam B, it affects both the beam PB angular intensity distribution in a pupil plane as well as the beam PB spatial intensity distribution in a field plane. The substrate may be located in a field plane. In this case, if the spatial intensity distribution of the beam PB in the field plane is adversely affected by the uniformity control apparatus, then the imaging performance of the lithographic apparatus may also be negatively affected.

A fixed grey filter 16 is used to compensate for the change in the spatial intensity distribution in the field plane caused by the uniformity control apparatus 14. The fixed grey filter is therefore used in order to try to make the spatial intensity distribution in the field plane (e.g., the planes where the patterning device and substrate are located) as uniform as possible. In some cases the fixed grey filter 16 may also be used to compensate for other undesirable characteristics of the radiation beam. The fixed grey filter 16 is located downstream of the uniformity control apparatus 14 and is configured such that it compensates for the change in the spatial intensity distribution in the field plane caused by the uniformity control apparatus 14 for a particular illumination mode of the radiation beam B which is produced by the illumination mode control arrangement 12. One way in which the fixed grey filter 16 may be configured, such that it can compensate for the change in the spatial intensity distribution in the field plane caused by the uniformity control apparatus 14, is that the fixed grey filter 16 may have a radiation transmission ratio (i.e., the proportion of radiation that the grey filter will allow to pass through it) which varies across the fixed grey filter 16. If the illumination mode of the radiation beam produced by the illumination mode control arrangement 12 is changed, then the fixed grey filter 16 will no longer be optimised to compensate for the change in the spatial intensity distribution in the field plane caused by the uniformity control apparatus 14. In this situation, because the fixed grey filter 16 is not optimised to compensate for the change in the spatial intensity distribution in the field plane caused by the uniformity control apparatus 14, a reduction in the imaging performance of the lithographic apparatus may be caused.

One way in which this situation may be rectified is by removing the fixed grey filter 16 and replacing it with a fixed grey filter which is optimised for the new illumination mode. It may be undesirable to remove and replace the fixed grey filter 16 because to do so may be a time consuming and complicated procedure. Such a replacement of the fixed grey filter 16 may therefore adversely affect the throughput for production rate) of the lithographic apparatus. Furthermore, it may be impractical to have an optimised fixed grey filter for every illumination mode of the lithographic apparatus.

Downstream of the fixed grey filter 16 is a slit shaping apparatus 18, which is used control the dimensions of the radiation beam which is output from the illuminator IL as the conditioned radiation beam PB.

FIGS. 3a and 3b show a radiation intensity filter according to an embodiment of the present invention which may replace the fixed grey filter of lithographic apparatus. FIG. 3a shows the radiation intensity filter in a disassembled condition and FIG. 3b shows the radiation intensity filter in an assembled condition. As can be seen most clearly in FIG. 3a, the radiation intensity filter 20 comprises a first member 22 and a second member 24. In this case, the first member 22 and second member 24 each comprise a generally planar plate (25a and 25b respectively) formed from a material which is substantially transparent to the radiation beam of the lithographic apparatus. It will be appreciated that in other embodiments of the present invention, the first and second members may be formed from any appropriate material which is not opaque to the radiation beam of the lithographic apparatus. Each of the first member 22 and second member 24 also has a plurality of opaque regions (26a and 26b respectively) which in this case are formed from a material which is substantially opaque to the radiation of the lithographic apparatus. In this embodiment, the opaque regions 26a and 26b are attached to each of the respective plates 25a, 25b. The opaque regions 26a, 26b of the present embodiment are all congruent and circular in shape. Because all the opaque regions 26a and 26b are congruent, they all have the same size and shape.

FIG. 3b shows two separate view of the radiation intensity filter 20 in an assembled state. The view on the left of the Figure shows a front view of the radiation intensity filter and the view of the right of the Figure shows a side view of the radiation intensity filter 20. FIG. 3b shows that in an assembled condition the first and second members 22, 24 are arranged such that they are adjacent one another and such that the planes of the first and second members 22, 24 lie parallel to one another. The first and second members 22, 24 are also arranged such that the first and second members are moveable relative to one another.

The radiation intensity filter 20 may be inserted within the known lithographic apparatus described above such that it replaces the fixed grey filter. In this case, the radiation intensity filter 20 may be inserted into the illumination system (also referred to as the illuminator) of the lithographic apparatus such that the optical axis of the radiation beam passing through the illumination system is perpendicular to the planes of the first and second members 22, 24. The direction of the optical axis of the illumination system is indicated by the arrow z in the right hand view of FIG. 3b. The radiation intensity filter is mounted within the lithographic apparatus such that the radiation beam passes through both the first member 22 and the second member 24. It follows that the front view of the radiation intensity filter 20 shown in the left of FIG. 3b is a view of the radiation intensity filter 20 along the optical axis of the radiation beam passing through the illumination system.

FIG. 3b shows the first member 22 and second member 24 in a first relative position in which at least a portion of one of the opaque regions 26a of the first member 22 overlaps in the direction of the optical axis z with a portion of one of the opaque regions 26b of the second member 24. In fact, in the first relative position of the first and second members 22, 24 shown in FIG. 3b, each of the opaque regions 26a of the first member 22 completely overlap a corresponding opaque region 26b of the second member 24.

FIG. 4 shows two separate views of the radiation intensity filter 20 in which the first and second members 22, 24 are in a second relative position. The view on the left of FIG. 4 shows a front view of the radiation intensity filter 20, whereas the view on the right of FIG. 4 shows a side view of the radiation intensity filter 20. As before, the direction arrow labelled z in the right hand view of FIG. 4 indicates the direction of the optical axis when the radiation intensity filter 20 is in situ within the illumination system of the lithographic apparatus. In order to move between the first relative position shown in FIG. 3b and the second relative position shown in FIG. 4 the first member 22 has been moved down (having regard to the orientation of the Figure) relative to the second member 24. Thus, the relative movement between the first and second members is in a direction that is perpendicular to the optical axis z. In some embodiments the direction of the relative movement between the first and second members 22, 24 may be parallel to a scanning direction of the lithographic apparatus. It will be appreciated that in order to move the first and second members 22, 24 from the first relative position to the second relative position, it is also possible that the second member is moved upwards (having regard to the orientation of the Figure) relative to the first member 22.

It can be seen that in the second relative position the total area of overlap in the direction of the optical axis of the opaque regions 26a of the first member 22 with the opaque regions 26b of the second member 24 is less than the overlap in the first relative position (as shown in FIG. 3b). In this way, if a beam of radiation is directed through the radiation intensity filter 20 along the optical axis Z (i.e., perpendicular to the plane of the first member 22 or second member 24), then the total area of the radiation beam which will be blocked by the opaque regions 26a, 26b of the first and second members 22, 24 will be greater in the second relative position than that blocked in the first relative position. It follows that the total power of the radiation beam which will pass through the radiation intensity filter 20 is greater when the first and second members 22, 24 are in the first relative position compared to that when the first and second members 22, 24 are in the second relative position.

In another second relative position (not shown) of the first member 22 and the second member 24 none of the opaque legions 26a of the first member overlaps any of the opaque regions 26b of the second member 24. In this second relative position, the total area of the radiation beam which is intercepted by the opaque regions 26a, 26b of the first and second members in the second relative position is double that of the total area of the radiation bean which is intercepted by the opaque regions 26a, 26b in the first relative position.

It will be appreciated that by controlling the relative displacement (i.e., away from the first relative position) of the first and second members 22, 24 in any given second relative position of the first and second members 22, 24, it is possible to control the amount of overlap (in the direction of the optical axis of the radiation beam) between the opaque regions 26a, 26b of the first and second members 22, 24. By controlling the amount of overlap between the opaque regions 26a, 26b, it is possible to control the area of the radiation beam which is blocked by the opaque regions 26a, 26b of the first and second members 22, 24, and hence control the intensity of the radiation which passes through the radiation intensity filter (also known as the transmission ratio of the radiation intensity filter). In general, the greater the relative displacement of the first and second members 22, 24 in any given second relative position of the first and second members, the less the overlap (in the direction of the optical axis of the radiation beam) between the opaque regions 26a, 26b of the first and second members 22, 24 will be. It follows that in general, the greater the relative displacement of the first and second members 22, 24 in any given second relative position of the first and second members, the less the intensity of the radiation which passes through the radiation intensity filter will be.

Figure 5:
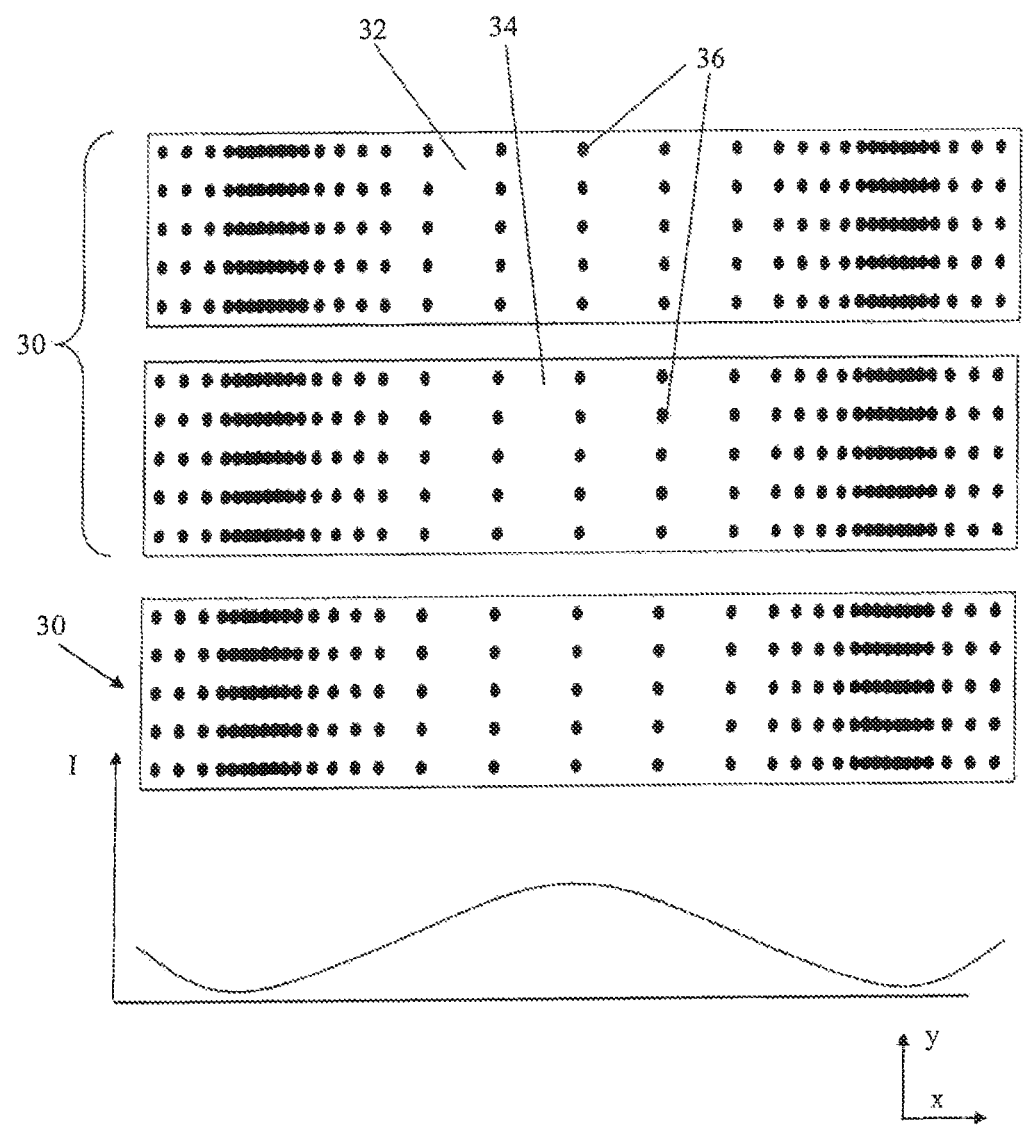
FIGS. 5, 6 and 7 depict a radiation intensity filter in accordance with a second embodiment of the present invention and corresponding graphs.
Figure 6:
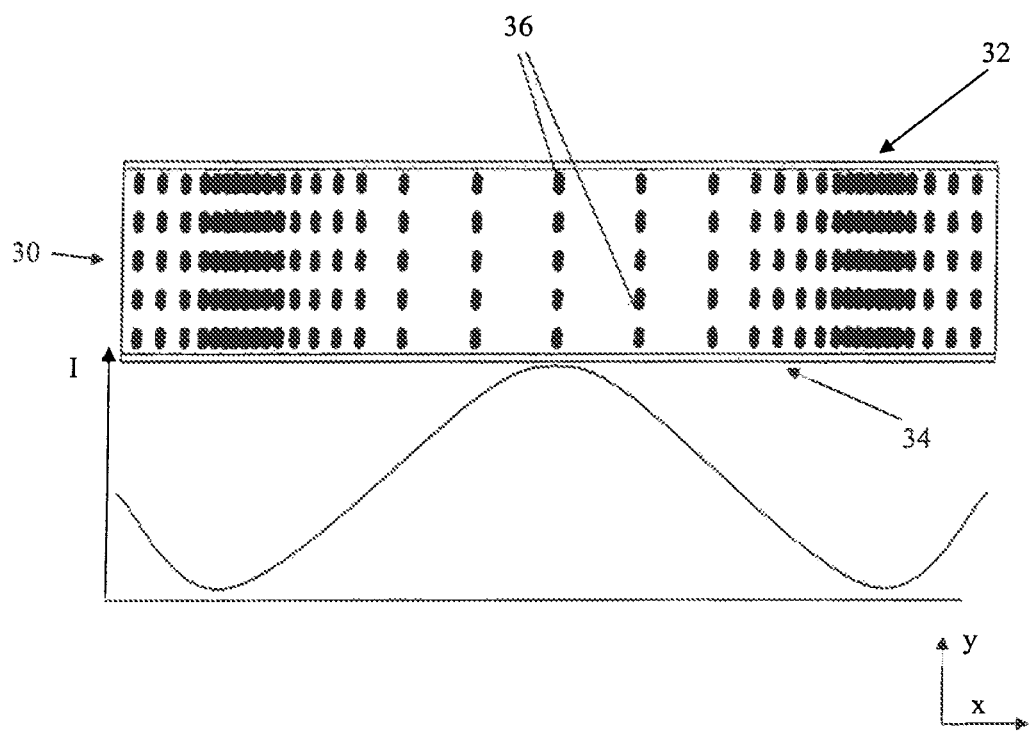
Figure 7:
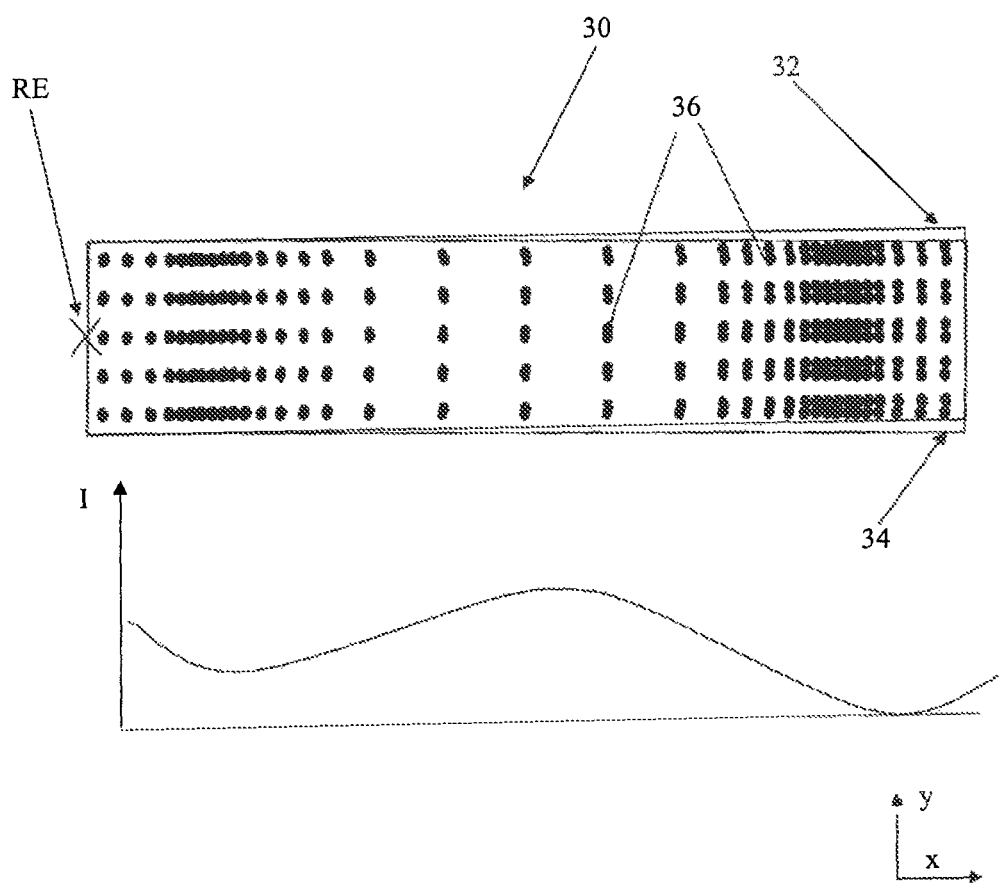

FIGS. 5, 6 and 7 show an alternative embodiment of a radiation intensity filter according to the present invention. Again, the radiation intensity filter 30 comprises a first member 32 and a second member 34. The first member 32 and second member 34 each comprise a substantially planar plate formed from a material which is substantially transparent to the radiation of the lithographic apparatus. Each of the first and second members 32, 34 has a plurality of opaque regions 36. In this embodiment, the opaque regions 36 may be formed from a material which is substantially opaque to the radiation beam of the lithographic apparatus. The opaque regions 36 are attached to the plates of the first member 32 and second member 34. The opaque regions 36 may be attached the first or second members 32, 34 in any appropriate manner, or may be formed integrally with the first or second members 32, 34.

The upper part of FIG. 5 shows front views of each of the first and second members 32, 34 when they are disassembled. The lower portion of FIG. 5 shows a front view of the radiation intensity filter 30 when assembled. The front view of the assembled radiation filter 30 shown in the lower portion of FIG. 5 shows the first member 32 and second member 34 in a first relative position wherein the opaque regions 36 of the first member 32 completely overlap with the opaque regions 36 of the second member 34 in the direction of the optical axis of the radiation beam which passes through the radiation intensity filter 30. In the case shown in FIG. 5, the direction of the optical axis of the beam of radiation is perpendicular to the plane of the Figure.

It can be seen that the pattern of distribution of the opaque regions 36 of the first and second members 32, 34 is different to that of the pattern of distribution of the opaque regions 26a, 26b of the first and second members 22, 24 of the embodiment shown in FIGS. 3a, 3b and 4. The pattern of distribution of the opaque regions 36 of the first and second members 32, 34 is such that the density of the opaque regions 36 varies along a direction indicated by x. In this particular embodiment the density of the opaque regions 36 is generally greater close to the periphery of the first and second members 32, 34 (in the x direction) than it is at the centre of the first and second members 32, 34 (in the x direction).

The graph at the bottom of FIG. 5 shows the average intensity (I) of radiation which passes through the radiation intensity filter 30 as a function of position along the radiation intensity filter 30 in the x direction. It can been seen that the greater the density of the opaque regions 36 in the x direction at any given position along the radiation intensity filter, the less the average intensity of radiation passing through the radiation intensity filter 30 at that position is. This is because, the greater the density of the opaque regions 36, the greater the relative total area of the opaque regions 36 there is at that position. The greater the total area of opaque regions 36 at any given position, the more radiation will be blocked by the opaque region 36 and hence the less radiation will pass through the radiation intensity filter.

In some embodiments of the present invention, the x direction may correspond to a direction which is transverse (or perpendicular to) the scanning direction of the lithographic apparatus.

FIG. 6 shows a front view of the radiation intensity filter 30 shown in FIG. 6 with the first and second members 32, 34 in a second relative position. In order to move the first member 32 and second member 34 relative to one another between the first relative position (shown in FIG. 5) and the second relative position (shown in FIG. 6), the first member 32 has been moved relative to the second member 34 in a direction y. In the second relative position, the total area of overlap in the direction of the optical axis of the opaque regions 36 of the first member 32 of the opaque regions 36 of the second member 34 is less than that in the first relative position (as shown in FIG. 5).

The graph at the bottom of FIG. 6 shows the average intensity (I) of radiation which passes through the radiation intensity filter 30 as a function of position along the radiation intensity filter 30 in the x direction. The average intensity (I) of radiation which passes through the radiation intensity filter 30 as a function of position along the radiation intensity filter 30 in the x direction may also be referred to as the intensity distribution of the beam of radiation which has passed through the radiation intensity filter. The graph shows that, when compared to the equivalent graph shown in FIG. 5, although the shape of the average transmitted intensity profile along the radiation intensity filter 30 is substantially similar, the difference between the maximum average intensity and minimum average intensity of radiation which passes through the radiation intensity filter 30 is greater.

FIG. 7 shows the radiation intensity filter 30 of FIGS. 5 and 6, where the relative position of the first member 32 and second member 34 is an alternative second relative position to that shown in FIG. 6. In order to move a first member 32 relative to the second member 34 from the first relative position shown in FIG. 5 to the alternative second relative position shown in FIG. 7, the first member 32 and second member 34 are rotated relative to one another. The relative rotation of the first and second members 32, 34 occurs in a plane which is parallel to the planes of the first member 32 and second member 34. The relative rotation of the first and second members 32, 34 occurs about an edge portion of the first and second members 32, 34 which is marked on the Figure by the cross labelled RE.

The graph at the bottom of FIG. 7 shows the average intensity (I) of radiation which passes through the radiation intensity filter 30 as a function of position along the radiation intensity filter 30 in the x direction. It can be seen that the average intensity profile in the x direction shown in the graph (which corresponds to the first and second members 32, 34 being in the alternative second relative position shown in FIG. 7) is similar in shape to that shown in the graph in FIG. 5 (which corresponds to the first and second members are 32, 34 being in the first relative position). However, the profile of the graph shown in FIG. 7 is tilted in a generally clockwise direction relative to the graph shown in FIG. 5. That is to say that the intensity of radiation transmitted through the radiation intensity filter 30 at the side of the radiation intensity filter 30 which is closer to the rotation point RE is generally greater than the transmitted intensity of radiation through the side of the radiation intensity filter 30 which is further away from the point of rotation RE. Returning to the upper view of FIG. 7 (which shows the radiation intensity filter 30 with the first member 32 and second member 34 in the alternative second position), the reason for this can be deduced. Rotating the first member 32 relative to the second member 34 about the point RE results, for any given angle of relative rotation, in there being a greater relative displacement between the first and second member 32, 34 the further it is away from the point of rotation RE. A greater relative displacement between the first and second members 32, 34 at any point will result in the opaque regions 36 of the first and second members 32, 34 overlapping less (in the direction of the optical axis of a lithographic apparatus). Reducing the overlap of the opaque regions 36 will increase the area of radiation which is blocked by the opaque regions 36, and therefore reduce the intensity of radiation passing through the radiation intensity filter 30 at that point.

Figure 8:
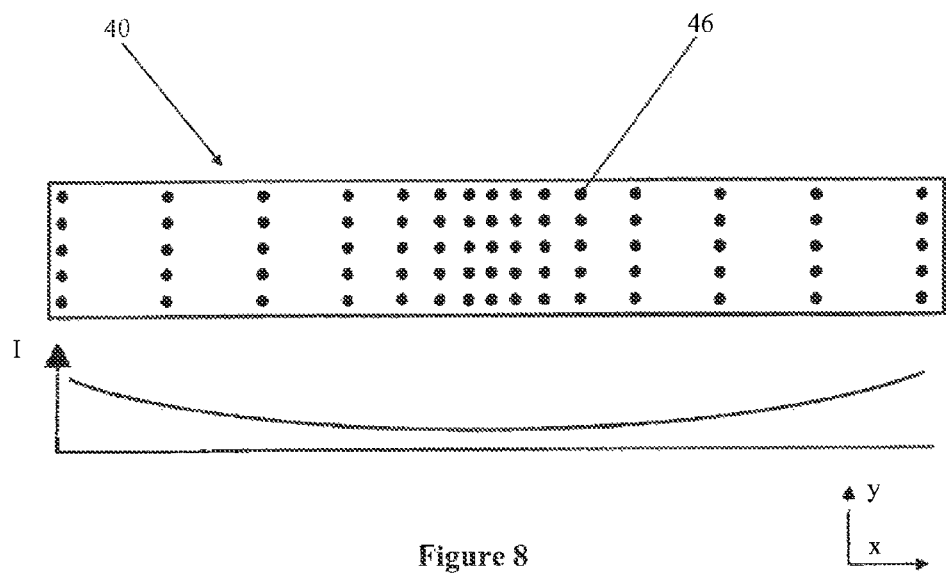
FIGS. 8 and 9 depict a radiation intensity filter in accordance with a third embodiment of the present invention and corresponding graphs.
Figure 9:
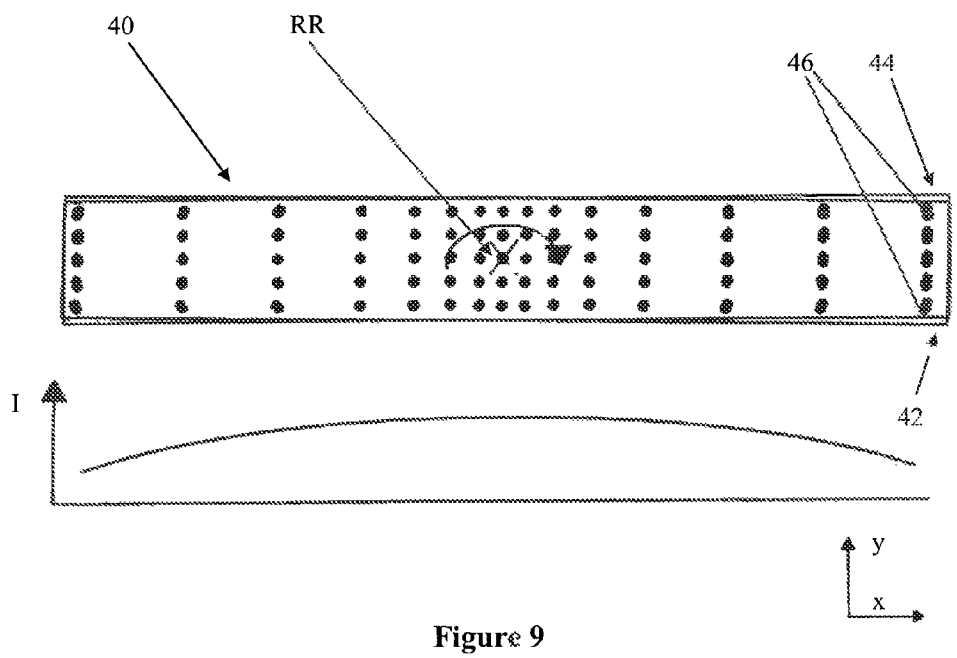

FIGS. 8 and 9 show an alternative radiation intensity filter 40 according to the present invention. FIG. 8 shows a front view of the radiation intensity filter 40 where the first member and second member are in a first relative position. The graph at the bottom of FIG. 8 shows the average intensity (I) of radiation which passes through the radiation intensity filter 40 as a function of position along the radiation intensity filter 40 in the x direction. The graph shows that the average intensity of radiation transmitted through the radiation intensity filter 40 is generally greater at the periphery (in the x direction) of the radiation intensity filter 40 compared to that in the centre of the radiation intensity filter. As previously discussed, this is due to the fact that the density of opaque regions 46 on the first and second members of the radiation intensity filter 40 is generally greater at the centre of the radiation intensity filter 40 compared to at the periphery (in the x direction).

FIG. 9 shows the radiation intensity filter 40 of FIG. 8, but wherein the first member 42 and second member 44 are in a second relative position. In order to move the first member 42 relative to the second member 44 from the first relative position (shown in FIG. 8) to the second relative position (as shown in FIG. 9) the first member 42 has been rotated in a clockwise direction relative to the second member 44 about a centre portion (indicated by the cross labelled RR) of each of the first and second members 42, 44.

The graph at the bottom of FIG. 9 shows the average intensity (I) of radiation which passes through the radiation intensity filter 40 (when the first and second members 42, 44 are in the second relative position) as a function of position along the radiation intensity filter 40 in the x direction. The profile (in the x direction) of the average intensity of radiation transmitted through the radiation intensity filter 40 shown in the graph been generally inverted compared to that shown in the graph of FIG. 8. That is to say that the average intensity of radiation transmitted through the radiation intensity filter 40 is greater near the centre of the radiation intensity filter 40 compared to at the periphery (in the x-direction) of the radiation intensity filter 40. As described in relation to FIG. 7, this is because the relative rotation between the first member 42 and second member 44 about the central portion RR of the first and second members 42, 44 causes greater relative displacement between the first member 42 and second member 44 (for a given angle of relative rotation) further away from the point around which the relative rotation occurs. In this case, the relative rotation occurs about a central portion RR of the first and second members 42, 44. Therefore (for a given angle of relative rotation between the first and second members 42, 44) there is a greater relative displacement between the first and second members 42, 44 at the periphery of the first and second members 42, 44 (i.e., the portions of the first and second members 42, 44 which are furthest away from the central portion RR) compared to near the centre of the first and second members 42, 44 (i.e., where the distance from the central portion RR is less). As previously discussed, because there is a greater relative displacement between the first and second members 42, 44 at the periphery of the radiation intensity filter 40 compared to at the centre of the radiation intensity filter 40, there is less overlap (when the first and second members 42, 44 are in the second relative position) of the opaque portions 46 of the first and second members 42, 44 at the periphery of the radiation intensity filter 40 compared to at the centre of the radiation intensity filter 40. Because there is less overlap between the opaque regions 46 of the first and second members 42, 44 at the periphery of the radiation intensity filter compared to at the centre of the radiation intensity filter 40, the total area of the radiation beam which is blocked by the opaque regions of the first and second members 42, 44 at the periphery of the radiation intensity filter 40 will be greater than the total area of the radiation beam which is blocked by the opaque regions 46 of the first and second members 42, 44 at the centre of the radiation intensity filter 40. It follows that, because the total area of the radiation beam passing through the radiation intensity filter 40 which is blocked by the opaque regions 46 is greater at the periphery of the radiation intensity filter 40 compared to at the centre, the average intensity of the radiation beam passing though the radiation intensity filter 40 will be generally greater at the centre of the radiation intensity filter 40 compared to at the periphery of the radiation intensity filter 40.

The radiation intensity filter 30 shown in FIG. 7 has first and second members 32, 34 which rotate relative to one another about an edge portion RE so as to reach the second relative position of the first and second members 32, 34. The radiation intensity filter 40 shown in FIG. 9 has first and second members 42, 44 which rotate relative to one another about a central portion RR to reach the second relative position. It will be appreciated that, in other embodiments of the present invention, the first and second members may be rotated relative to one another about any appropriate point. Regardless of the point chosen about which the relative rotation between the first and second members 42, 44 occurs, for a given angle of relative rotation, the relative displacement at any given position between the first and second members will be greater the further the given position is away from the point about which the relative rotation occurs. As previously discussed, the greater the relative displacement between the first and second members, the less overlap there will be between opaque regions of the first and second members. It follows that, at a given position, the less the overlap between the opaque regions of the first and second members, the greater the area of the radiation beam passing through the radiation intensity filter which will be blocked by the opaque regions of both the first and second members at that position.

Figure 10:
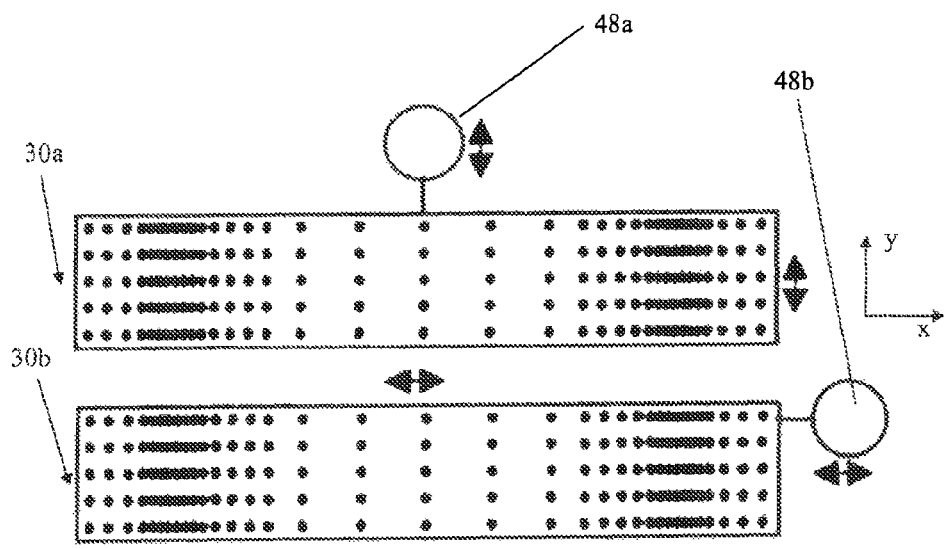
FIGS. 10 and 11 depict a radiation intensity filters in accordance with fourth and fifth embodiments of the present invention, each having a different actuator arrangement.
Figure 11:
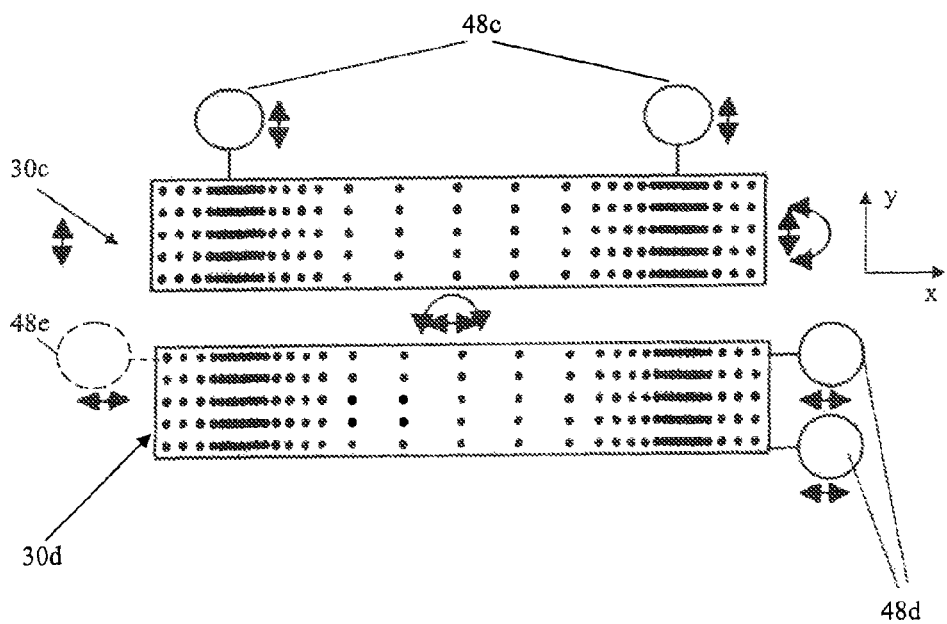

FIGS. 10 and 11 show various actuator arrangements which may be used to move the first and second members of the radiation intensity filter relative to one another. FIG. 10 shows two different embodiments of a radiation intensity filter (20a and 30b respectively) according to the present invention. Each of the radiation intensity filters 30a, 30b shown in FIG. 10 comprises a linear actuator 48a and 48b respectively which is mechanically linked to either the first member or the second member of the respective radiation intensity filter 30a, 30b. The other of the first member or second member in each embodiment (i.e., that which is not mechanically linked to the actuator 48a or 48b) is held in a fixed position. In each of the embodiments, the linear actuator 48a or 48b is used to move the first and second members of the radiation intensity filter 30a, 30b relative to one another in a linear manner. This relative linear movement between the first and second members of each of the radiation intensity filters 30a, 30b is used to move the first and second members from the first relative position to the second relative position as previously described. In the case of both of the embodiments of the radiation intensity filter shown in FIG. 10, they may be mounted within the lithographic apparatus such that the optical axis of the beam of radiation passing through them is perpendicular to the plane of the Figure.

In the embodiment shown in the upper view of FIG. 10 the actuator 48a will cause a linear relative movement between the first and second members which is parallel to the direction y. When the radiation intensity filter 30a is mounted in certain lithographic apparatus, the direction y may be perpendicular to the optical axis of the beam of radiation passing through the radiation intensity filter 30a. The direction y may also be parallel to a scanning direction of the lithographic apparatus.

In the embodiment shown in the lower view of FIG. 10 the actuator 48b will cause a linear relative movement between the first and second members which parallel to the direction x. When the radiation intensity filter 30a is mounted in certain lithographic apparatus, the direction x may be perpendicular to the optical axis of the beam of radiation passing through the radiation intensity filter 30a. The direction x may also be perpendicular (or transverse) to a scanning direction of the lithographic apparatus.

FIG. 11 shows two further embodiments of radiation intensity filters according to the present invention. In both cases the radiation intensity filters 30c, 30d each have two linear actuators. The radiation intensity filter 30c shown in the upper view of FIG. 11 has two linear actuators 48c both of which are mechanically linked to either the first member or the second member of the radiation intensity filter 30c. The other of the first or second members (i.e., that which is not mechanically linked to the actuators 48c) is held fixed such that the actuators 48c may cause relative movement between the first and second members.

In the case of the radiation intensity filter 30c, if both of the actuators 48c are actuated in the same direction to the same degree then the first and second members will undergo a linear relative movement parallel to the y direction. However, if the actuators 48c are actuated to a different extent or in different directions then the first member and second member will undergo a relative rotation. For example, if the actuators 48c are actuated an equal amount in opposite directions then the first and second members may rotate relative to one another about a central portion of the radiation intensity filter 30c. It will be appreciated that actuating each of the actuators 48c independently to different extents and/or in different directions will result in relative rotation between the first and second members about a different centre of rotation.

The lower view of FIG. 11 shows a radiation intensity filter 30d which has two linear actuators 48d which are both mechanically linked to the right hand side (having regard to the orientation of the Figure) of either the first member or second member of the radiation intensity filter 30d. In a similar manner to that discussed in relation to the radiation intensity filter 30c (shown in the upper view of FIG. 11), actuation of both the actuators 48d of the radiation intensity filter 30d to the same extent and in the same direction will result in a linear relative movement between the first member and second member. In the case of the radiation intensity filter 30d, such a linear relative movement between the first and second members would be parallel to the direction x. In some lithographic apparatus, the radiation intensity filter 30d may be mounted such that the direction x is substantially transverse to (or perpendicular to) the scanning direction of the lithographic apparatus. It will be appreciated that, in a similar manner to that discussed in relation to the radiation intensity filter 30c (shown in the upper view of FIG. 11), actuating the actuators 48d to different extents and/or in different directions will result in a relative rotation between the first member and the second member.

FIG. 11 also shows a further possible arrangement of actuators which may be used to produce relative movement between the first and second members. In this alternative arrangement, the radiation intensity filter has two linear actuators which are diagonally opposed. The actuators in this case would be actuator 48e (indicated in dash lines) and the lower (having regard to the orientation of the Figure) actuator of the actuators 48d. The presence of the actuators in this case at opposite sides of either the first member or second member means that using the actuators to produce a particular type of relative movement between the first member and second member is carried out in a slightly different manner to that of the two previously described actuator arrangements. In this case, a linear relative movement between the first and second members in the direction x is produced by actuating the actuators to the same extent in opposite directions (i.e., such that the mechanically linked first or second member is moved towards one actuator and away from the other). A relative rotation between the first and second members may be produced by actuating the actuators to different extents or by actuating the actuators in the same direction (i.e., such that the first or second member either moves towards both actuators or away from both actuators).

Figure 12:
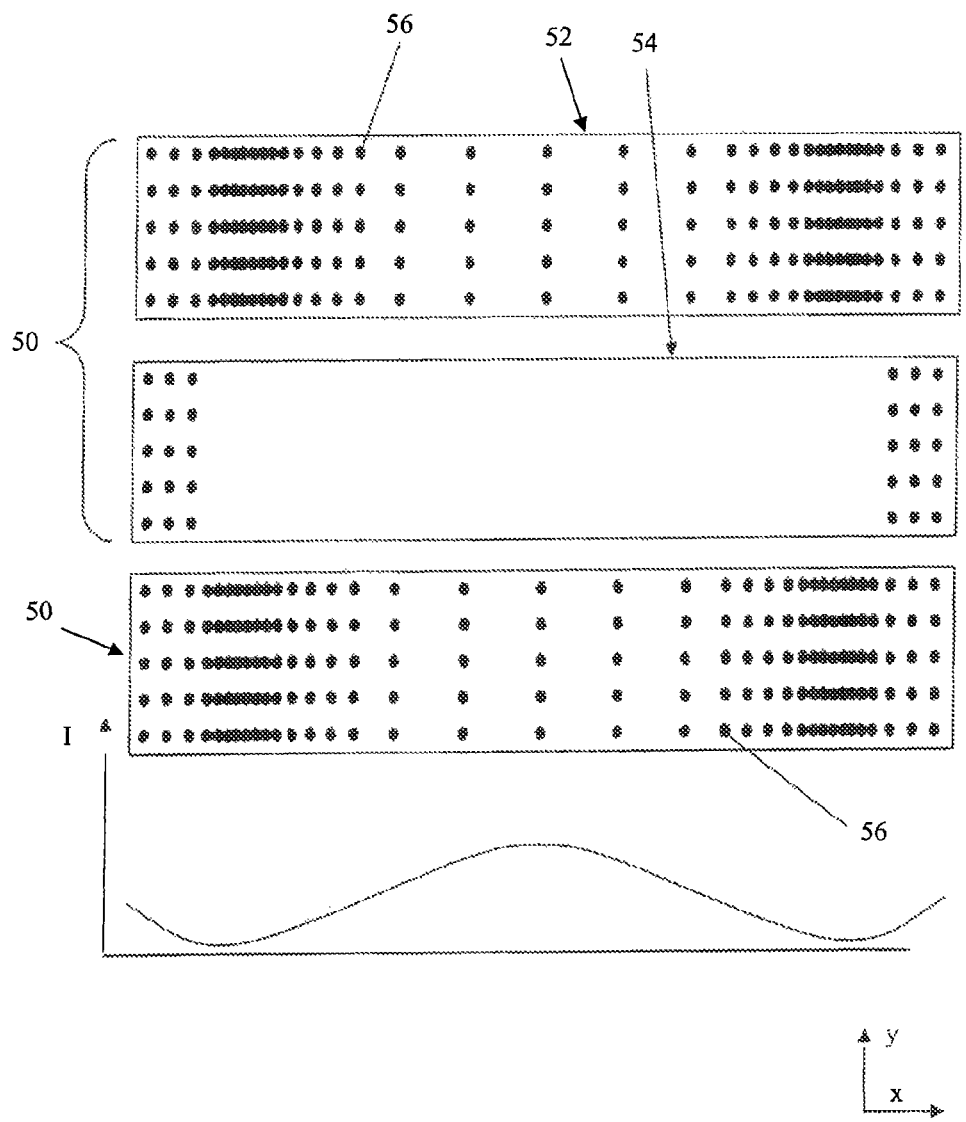
FIGS. 12 and 13 depict a radiation intensity filter in accordance with a sixth embodiment of the present invention and corresponding graphs.
Figure 13:
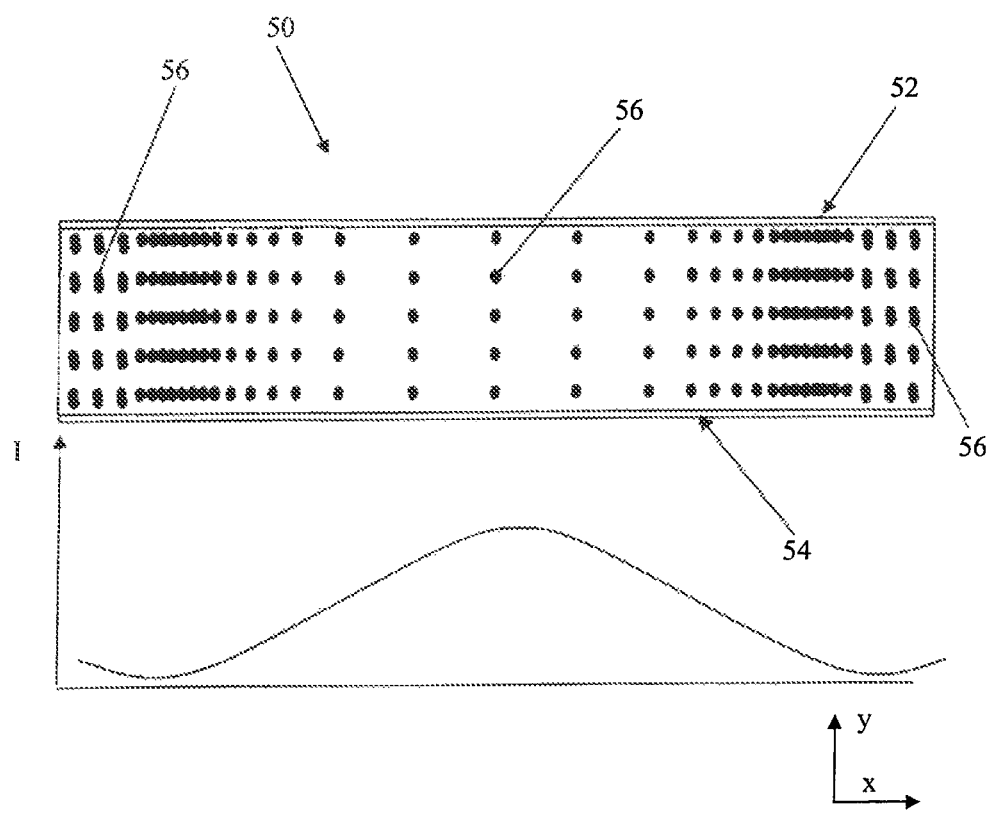

FIGS. 12 and 13 show a further embodiment of a radiation intensity filter 50 according to the present invention. The upper two views within FIG. 12 show the first member 52 and the second member 54 individually (i.e., in a disassembled condition). The third view in FIG. 12 shows a view of the radiation intensity filter 50 when the first and second members 52, 54 have been movably mounted adjacent one another.

In contrast to the previously discussed embodiments of the present invention, it can be seen that the pattern of opaque regions 56 or the first member 52 is different to that of the second member 54. In particular, the first and second members 52, 54 have the same pattern of opaque regions 56 at their periphery in the x direction. However, a central portion of the second member 54 is substantially free from opaque regions 56, whereas the first member 52 is not.

As shown in the third view down of FIG. 12, when the first and second members are movably mounted adjacent one another such that the first and second members 52, 54 are in a first relative position, the combined pattern of opaque regions 56 due to the opaque regions of both the first member and second member is the same as that of the first member 52 on its own and that of the radiation intensity filter 30 shown in FIG. 5. It follows that the average transmitted intensity profile of the radiation intensity filter 50 (with the first and second members in the first relative position) along the X direction is the same as that of the radiation intensity filter 30 (when the first and second members are in the first relative position) as shown in FIG. 5.

FIG. 13 shows the radiation intensity filter 50 of FIG. 12 where the first member 52 and second member 54 are in a second relative position. In this case, (having regard to the orientation of the Figure) the first member 52 has been moved upwards relative to the second member 54 (compared to the position of the first member 52 in the first relative position). When the first and second members 52, 54 are in the second relative position, as previously described, the overlap between the opaque regions 56 of the first member 52 and the opaque regions 56 of the second member 54 is reduced. In the case of this embodiment, because the second member 54 only has opaque regions 56 at its periphery in the x direction), the radiation intensity filter 50 only has overlapping opaque regions 56 of the first and second members 52, 54 at the periphery (in the x direction) of the radiation intensity filter 50. For this reason, in the second relative position of the radiation intensity filter 50, the total area of overlap in the direction of the optical axis of the opaque regions 56 of the first member 52 with the opaque regions 56 of the second member 54 is only reduced (relative to that in the first relative position) at the periphery (in the x direction) of the radiation intensity filter 50. Due to the fact that the overlap of the opaque regions of the first and second members 52, 54 is only reduced at the periphery of the radiation intensity filter 50, it is only at the periphery of the radiation intensity filter 50 that the total area of the radiation beam passing through the radiation intensity filter 50 that is blocked by the opaque regions 56 of the first and second members 52, 54 is increased when the first and second members 52, 54 are in the second relative position (compared to when the first and second members 52, 54 are in the first relative position). For this reason, the average intensity of the radiation beam which passes through the radiation intensity filter 50 when the first and second members 52, 54 are in the second relative position (as shown in the lower view of FIG. 13) is only reduced at the periphery (in the x direction) of the radiation intensity filter 50 compared to the average radiation intensity of the radiation beam passing through the radiation intensity filter 50 when the first and second members 52, 54 are in the first relative position.

Figure 14:
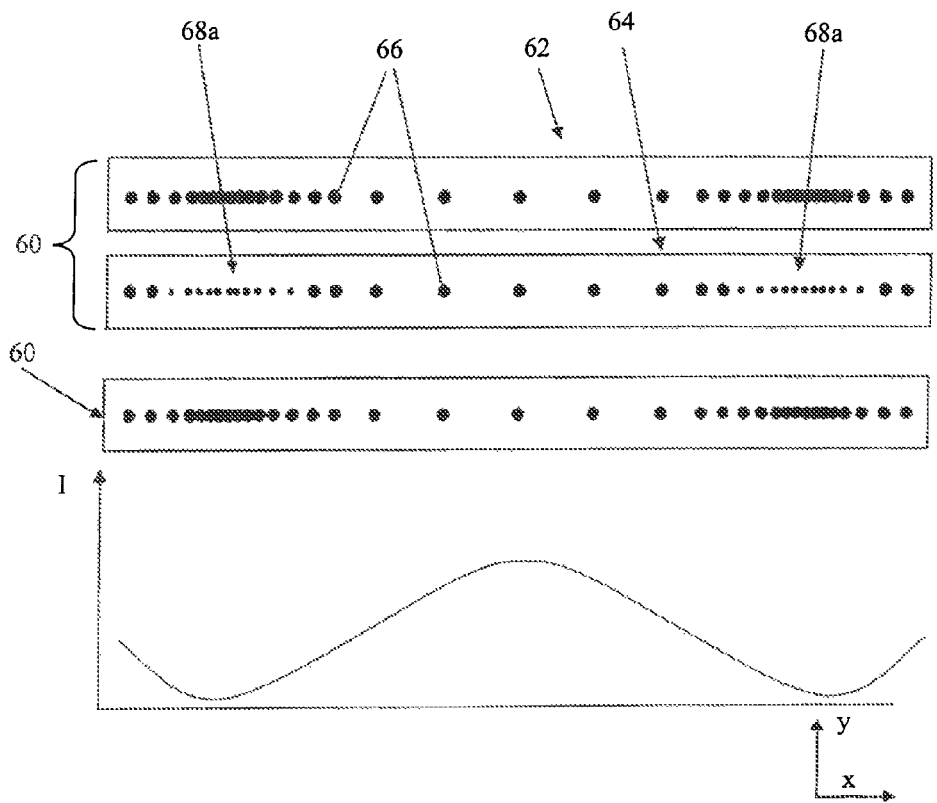
FIGS. 14 and 15 depict a radiation intensity filter in accordance with a seventh embodiment of the present invention and corresponding graphs.

FIG. 14 shows a further radiation intensity filter 60 according to the present invention. Again, the upper two views shown in FIG. 14 show the first member 62 and second member 64 of the radiation intensity filter 60 in a disassembled condition. The third view down in FIG. 14 shows a front view of the radiation intensity member 60 when the first and second members 62 and 64 have been mounted adjacent one another and are in a first relative position. It can be seen that, although the opaque regions 66 of each of the first and second members 62, 64 are similar (i.e., have the same shape), the second member 64 has two portions 68a in which the opaque regions 66 are smaller than the rest of the opaque regions 66 of the second member 64b. The opaque regions 66 of the two portions 68a are also smaller than the corresponding opaque regions 66 of the first member 62.

As shown in the third view down of FIG. 14, when the first and second members are in the first relative position, due to the fact that the opaque regions 66 of both the first and second members 62, 64 completely overlap, the total area of the opaque region 66 of the first and second members 62, 64 which block the beam of radiation is substantially the same as the area of the radiation beam that is blocked by the opaque region 66 of the first member 62. This is because it is the first member 62 which has opaque regions 66 which are larger than those of the second member 64 in the portions 68a, such that the opaque region 66 of the first member 62 completely overlap the opaque region 66 of the second member 64.

The graph at the bottom of FIG. 14 shows the average intensity (I) of radiation which passes through the radiation intensity filter 60 (when the first and second members 62, 64 are in the first relative position) as a function of position along the radiation intensity filter 40 in the x direction.

Figure 15:
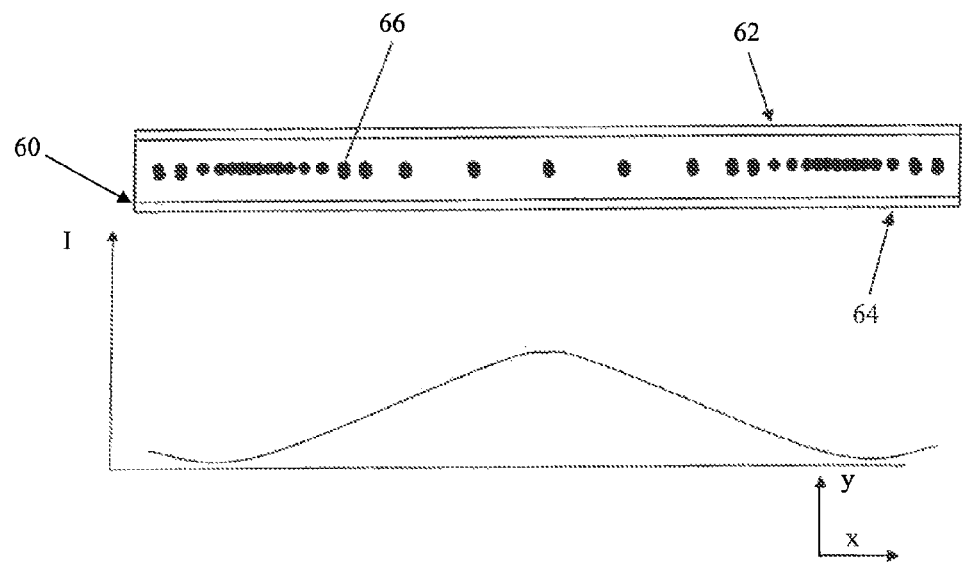

The upper portion of FIG. 15 shows the radiation intensity filter 60 with the first and second members in a second relative position. In a similar manner to the previous embodiments, the total area of overlap of the opaque regions 66 of the first and second members 62, 64 in the direction of the optical axis of the radiation beam is less in the second relative position than that in the first relative position. In this case, the first member 62 has been moved upwards (having regard to the orientation of the Figure) relative to the second member 64. In the second relative position shown in FIG. 15, the opaque region 66 of the portions 68a of the second member still completely overlap with the corresponding opaque region 66 of the first member 62. However, the larger opaque regions of the second member 64 which are outside of the portions 68a overlap less in the second relative position compared to the first relative position. For this reason, the opaque regions of the second member 64 which lie outside of the portions 68a, in combination with corresponding opaque regions of the first member, block more of the radiation passing through the radiation intensity filter 60 in the second relative position compared to when the first and second members are in the first relative position. The graph at the bottom of FIG. 15 shows the average intensity (I) of radiation which passes through the radiation intensity filter 60 as a function of position along the radiation intensity filter 40 in the x direction. The graph shows that the average intensity of radiation which passes through the radiation intensity filter 60 is less at positions along the radiation intensity filter 60 in the X direction which correspond to the positions which lie outside portions 68*a* of the second member, when the first and second members 62, 64 are in the second relative position compared to the first relative position. In the case of the graph shown in FIG. 15, this has resulted in a smoothing of the profile of the average intensity of radiation which is transmitted through the radiation intensity filter 60 when the first and second members 62, 64 are in the second relative position compared to when they are in the first relative position.

Figure 16:
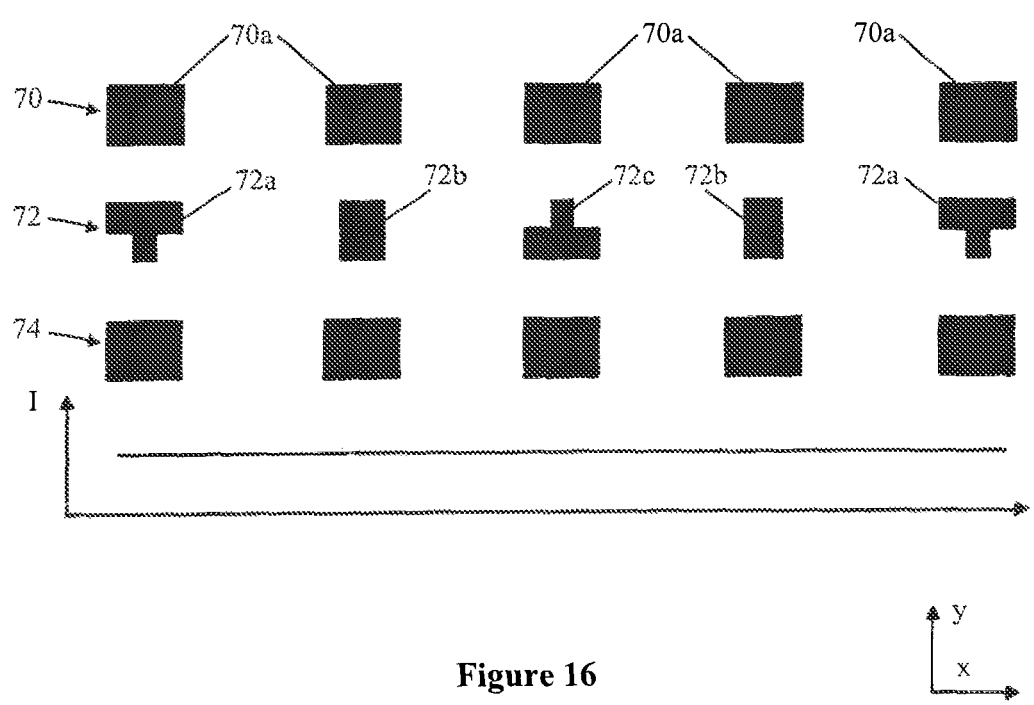
FIGS. 16, 17 and 18 depict opaque regions which may form part of a radiation intensity filter in accordance with an eighth embodiment of the present invention and corresponding graphs.
Figure 17:
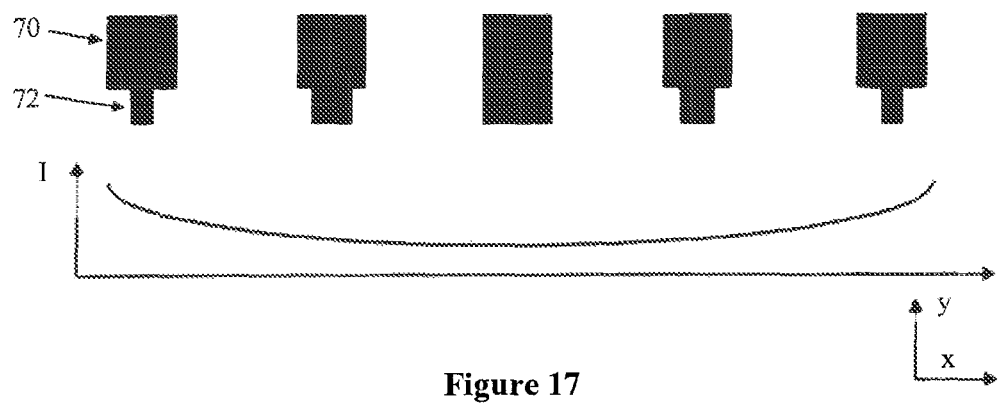
Figure 18:
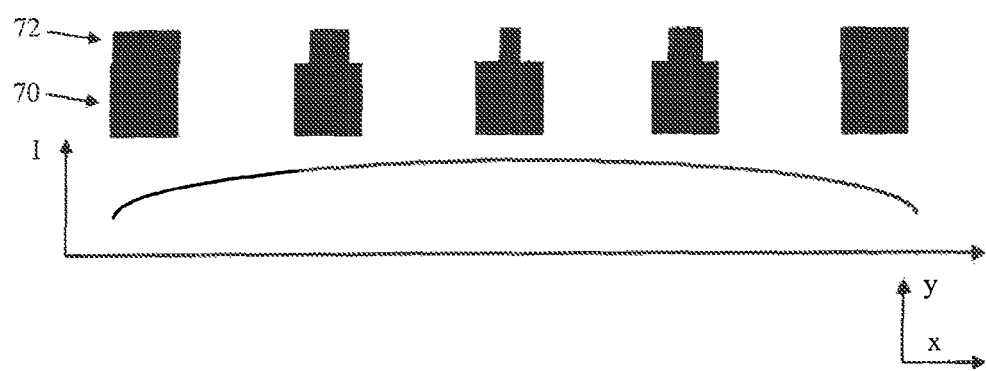

FIGS. 16, 17 and 18 show the opaque regions of a radiation intensity filter according to a further embodiment of the present invention (i.e., they show the opaque regions of the first and second members, but do not show the first and second members themselves). FIG. 16 shows a first set of opaque regions 70 and a second set of opaque regions 72. The first opaque regions 70 may form part of a first member of a radiation intensity filter according to the present invention, whereas the second set of opaque regions 72 may form part of a second member of the radiation intensity filter. The first set of opaque regions 70 has five congruent box-shaped opaque regions 70*a*. The second set of opaque regions 72 as three different types of opaque region. Moving from the left side of the Figure to the right side of the Figure, the opaque regions are arranged as follows: a first type of opaque region 72*a*, a second type of opaque region 72*b*, a third type of opaque region 72*c*, a second type of opaque region 72*b*, and a first type of opaque region 72*a*. The second type of opaque region 72*b* is symmetric about an axis which runs parallel to the x direction. In some lithographic apparatus, the radiation intensity filter may be mounted within the lithographic apparatus such that the x direction is transverse (or perpendicular) to the scanning direction of the lithographic apparatus. Both the first type of opaque region 72*a* and third type of opaque region 72*c* are non-symmetric with respect to an axis which runs parallel to the x direction. The first type of opaque region 72*a* is generally T-shaped and the third type of opaque region 72*c* is a generally inverted T-shape. Opaque regions of the first type 72*a* and the third type 72*c* will be referred to collectively as non-symmetric opaque regions. Each of the opaque regions which form part of the second set 72 of opaque regions is sized and shaped such that it can be completely overlapped by the corresponding opaque portions 70*a* which form part of the first set 70 of opaque portions. The third set 74 of opaque regions shows a view of both the first and second sets 70, 72 of opaque regions when they are aligned such that the first set of opaque regions 70 completely overlaps the second set of opaque regions 72. This may correspond to the relative positions of the opaque portions when the first member and second member of the radiation intensity filter are in the first relative position.

The graph at the bottom of FIG. 16 shows the average intensity (I) of radiation which passes through a radiation intensity filter 40 as a function of position along the radiation intensity filter in the x direction. In this case the radiation intensity filter has a first member having the first set 70 of opaque regions and a second member having the second set 72 of opaque regions. The first and second members are in a first relative position such that the opaque regions overlap in the manner shown by the third set 74 of opaque regions. The graph shows that when the first set of opaque regions 70 and second set of opaque regions 72 are aligned such that they overlap to define the opaque regions shown in set 74 (i.e., when the first and second members are in the first relative position), the average intensity profile of radiation which is transmitted through the radiation intensity filter of which the opaque regions form part is substantially constant as a function of position along the radiation intensity filter in the x direction.

FIGS. 17 and 18 show views of the opaque regions of the first and second sets 70, 72 combined when they are moved from the first relative position in which the first and second set 70, 72 of opaque regions totally overlap to two different second relative positions.

FIG. 17 shows the combination of the first and second sets of opaque regions 70, 72 when they are in a second relative position. In comparison to the first relative position (shown in FIG. 16), in the second relative position the first set of opaque regions 70 has been moved upwards (having regard to the orientation of the Figure) relative to the second set of opaque regions 72.

FIG. 18 shows the combination of the first and second sets of opaque regions 70, 72 when they are in an alternative second relative position. In comparison to the first relative position (shown in FIG. 16), in the alternative second relative position the first set of opaque regions 70 has been moved downwards (having regard to the orientation of the Figure) with respect to the second set of opaque regions 72. It follows that the direction of relative movement between the first relative position and the second relative position is opposite to that between the first relative position and the alternative second position.

The graphs at the bottom of FIGS. 17 and 18 show the average intensity (I) of radiation which passes through a radiation intensity filter comprising the first and second sets of opaque regions 70, 72 as a function of position along the radiation intensity filter in the x direction. The opaque regions 70, 72 of the radiation intensity filter are in a second relative position in FIG. 17 and in an alternative second relative position in FIG. 18.

Comparing the graphs shown in FIGS. 17 and 18, it can be seen that the profile of the average radiation intensity which is transmitted through the radiation intensity filter when the sets of opaque regions 70, 72 are in the second relative position (as shown in FIG. 17) differs to that when the sets of opaque regions 70, 72 are in the alternative second relative position (as shown in FIG. 18). In particular, the general shape of the profile of the graphs in FIGS. 17 and 18 in the x direction is substantially inverted. That is to say, in FIG. 17 a greater average intensity of radiation passes through the radiation intensity filter at its periphery (in the x direction) compared to the average intensity of radiation which passes through the radiation intensity filter at a central portion. The opposite is true of the opaque regions of FIG. 18, as shown by the graph of FIG. 18. The reason for this is that the non-symmetric opaque regions of the second set of opaque regions 72 are non-symmetric with respect to an axis which is parallel to the x direction. The axis with respect to which the second set of opaque regions 72 is non-symmetric is also generally transverse (or perpendicular) to the direction of relative movement that occurs as the set of opaque regions 70, 72 move between the first relative position and the second relative position (or the alternative second relative position). The non-symmetric nature of the non symmetric opaque regions of the second set of opaque regions 72 results in there being a different area of overlap between the first set of opaque regions 70 and the second set of opaque regions 72 when the opaque regions are in the second relative position compared to the alternative second relative position. It follows that moving the first set of opaque regions 70 relative to the second set of opaque regions 72 (or vice-versa) in a first direction results in a different combined shape of the opaque regions 70, 72 (as viewed along the optical axis of the radiation) compared to the combined shape of the opaque regions 70, 72 when the first set of opaque regions 70 is moved relative to the second set of opaque regions 72 (or vice-versa) in a second direction. In this case, the first and second directions are opposite to one another, but this need not be the case. Because the combined shape of the non-symmetric opaque regions of the second set of opaque regions 72 and the corresponding opaque regions of the first set of opaque regions 70 is different depending on the direction of relative movement between the first and second opaque regions 70, 72 when the first and second sets of opaque regions 70, 72 move between the first and second relative positions, the total area of the radiation beam which is blocked by the combination of each non-symmetric opaque region of the second set of opaque regions 72 and its corresponding opaque region of the first set of opaque regions 70 is also dependent on the direction of the relative movement between the first and second sets 70, 72 of opaque regions when the first and second sets of opaque regions 70, 72 move between the first and second relative positions. It follows that different profile shapes of the average radiation intensity transmitted through the radiation intensity filter can be created by using non-symmetric opaque regions as part of a second member which can be moved relative to corresponding opaque regions of a first member in opposite directions which are perpendicular to an axis about which the non-symmetric opaque regions are non-symmetric.

Figure 19:
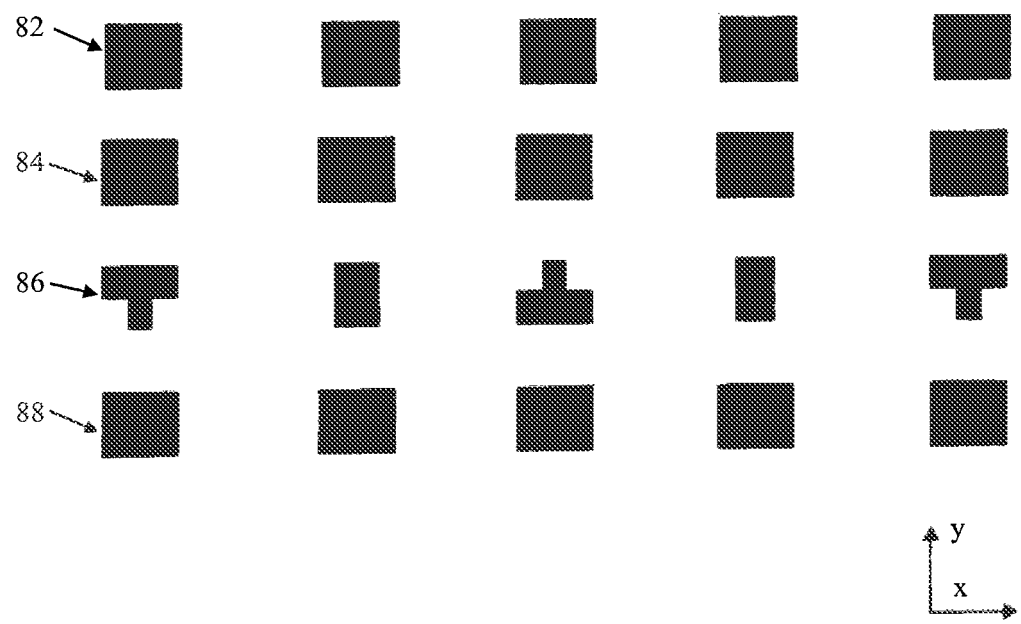
FIGS. 19 and 20 depict opaque regions which may form part of a radiation intensity filter in accordance with a ninth embodiment of the present invention and corresponding graphs.

FIG. 19 shows three sets of opaque regions which may form part of a further embodiment of the present invention. For example, the first set of opaque regions 82 may form part of a first member of a radiation intensity filter, the second set 84 of opaque regions may form part of a second member of the radiation intensity filter, and a third set 86 of opaque regions may form part of a third member of the radiation intensity filter. The third member of the radiation intensity filter may have a similar form to that of the first and second members which have previously been described in relation to preceding embodiments. It follows that an embodiment of the present invention may have first, second and third members that are arranged such that they generally form a stack and such that they are independently movable relative to one another.

The first set of opaque regions 82 and second set of opaque regions 84 are substantially the same as the first set of opaque regions 70 shown in FIGS. 16 to 18. The third set of opaque regions 86 are substantially the same as the second set of opaque regions 72 shown in FIGS. 16 to 18.

By having a radiation intensity filter which has three individual members (first, second and third members) which are independently movable relative to one another, this gives a greater degree of freedom and choice as to the combined shape of the opaque regions which can be created (compared to when using a radiation intensity filter which has only two members).

Figure 20:
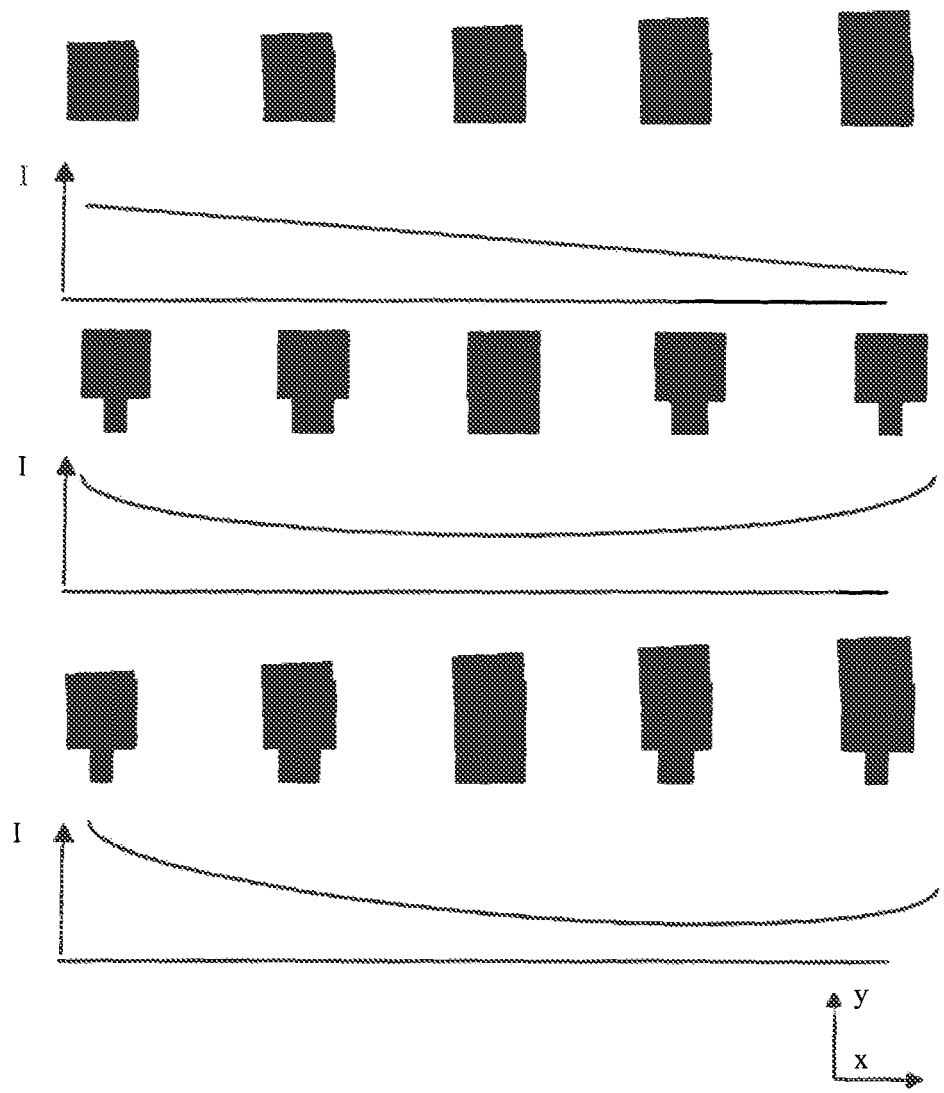

FIG. 20 shows three different possible sets of combined opaque regions which can be created by moving the first, second and third members relative to one another. The graphs below each of the different sets of combined opaque regions show the average intensity (I) of radiation which passes through a radiation intensity filter comprising the respective set of combined opaque regions as a function of position along the radiation intensity filter in the x direction. The graphs within FIG. 20 show that by moving three sets of opaque regions relative to one another it is possible to create a radiation intensity filter which has a variety of shapes of transmitted average radiation intensity profile in the x direction. It will be appreciated that it is within the scope of the present invention for the radiation intensity filter to have any appropriate number of members that are movable relative to one another, each member having opaque regions.

It will be appreciated that it is within the scope of the present invention for a radiation intensity filter to have any appropriate number of stacked members having opaque regions (for example, 2, 3, 4 or 5), provided that the members (and hence the opaque regions) may overlap in the direction of the optical axis of the beam of radiation.

Figure 21:
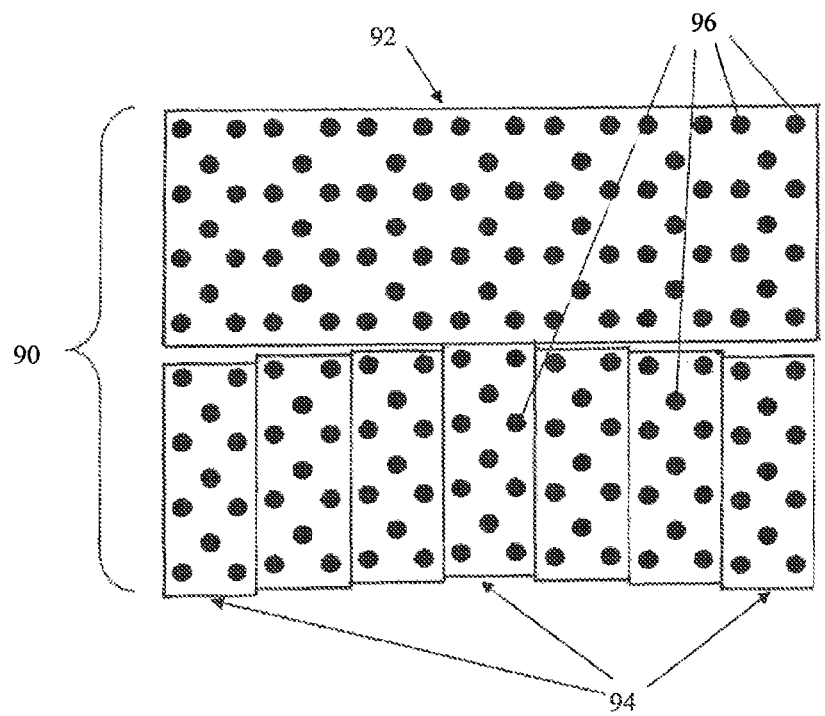

FIGS. 21, 22, 23, and 24 show a radiation intensity filter according to a further embodiment of the present invention. FIG. 21 shows a view of the radiation intensity filter 90 which has a first member 92 and a plurality of second members 94. Within FIG. 21 the first member 92 and second members 94 are shown in a disassembled condition to aid clarity. Both the first member 92 and second members 94 have a plurality of opaque regions 96. The opaque regions 96 are substantially opaque to the radiation beam of an illumination system of a lithographic apparatus of which the radiation intensity filter 90 may form part.

Figure 22:
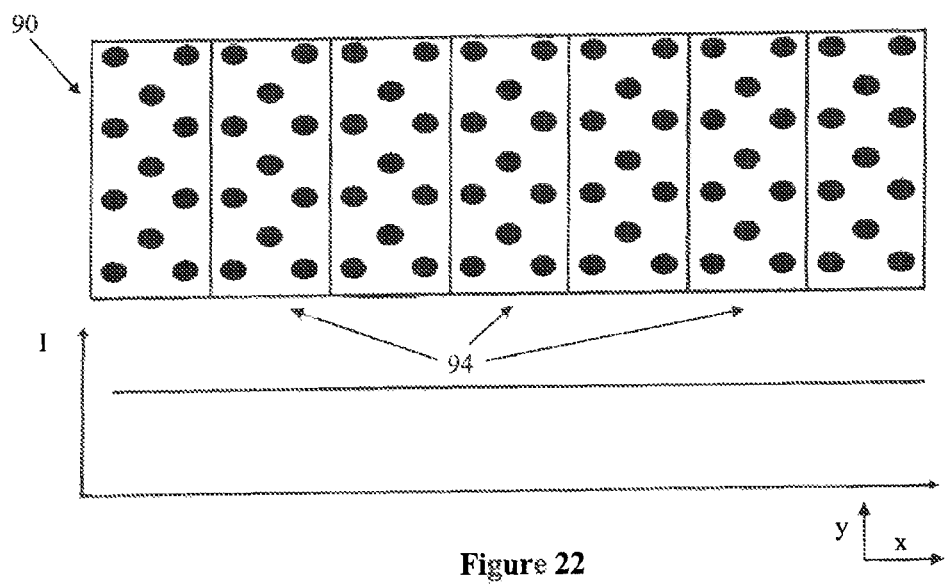

As shown in FIG. 22, when the first member 92 and second members 94 are in an assembled condition, they are generally adjacent one another such that a beam of radiation passing through the radiation intensity filter 90 will pass through the first member 92 and then the second members 94 (or vice versa). The second members 94 are arranged alongside one another such that they extend across substantially the entire first member 92 in the x direction. The second members 94 are mounted such that they are individually movable relative to the first member 92 parallel to a direction y. The radiation intensity filter 9 may be mounted within a lithographic apparatus such that the direction y is substantially perpendicular to the optical axis of a radiation beam of the lithographic apparatus. In the shown embodiment, the optical axis of the beam of radiation which passes through the radiation intensity filter 90 is perpendicular to the plane of the Figure. In some embodiments, the direction y may be substantially parallel to a scanning direction of the lithographic apparatus.

In FIG. 22 each of the second members 94 is positioned relative to the first member in a first relative position. In the first relative position, at least a portion of one of the opaque regions 96 of the first member overlaps in the direction of the optical axis with a portion of one of the opaque regions 96 of the respective second member. In this case, the opaque regions of the first member and second members are arranged such that each opaque region of the first member completely overlaps (in the direction of the optical axis) a corresponding opaque region 96 of one of the second members 94.

The graph at the bottom of FIG. 22 shows the average intensity (I) of radiation which passes through a radiation intensity filter 90 as a function of position along the radiation intensity filter 90 in the x direction. The graph shows that the average intensity of radiation transmitted through the radiation intensity filter 90 is substantially constant with respect to the position across the radiation intensity filter 90 in the x direction.

Figure 23:
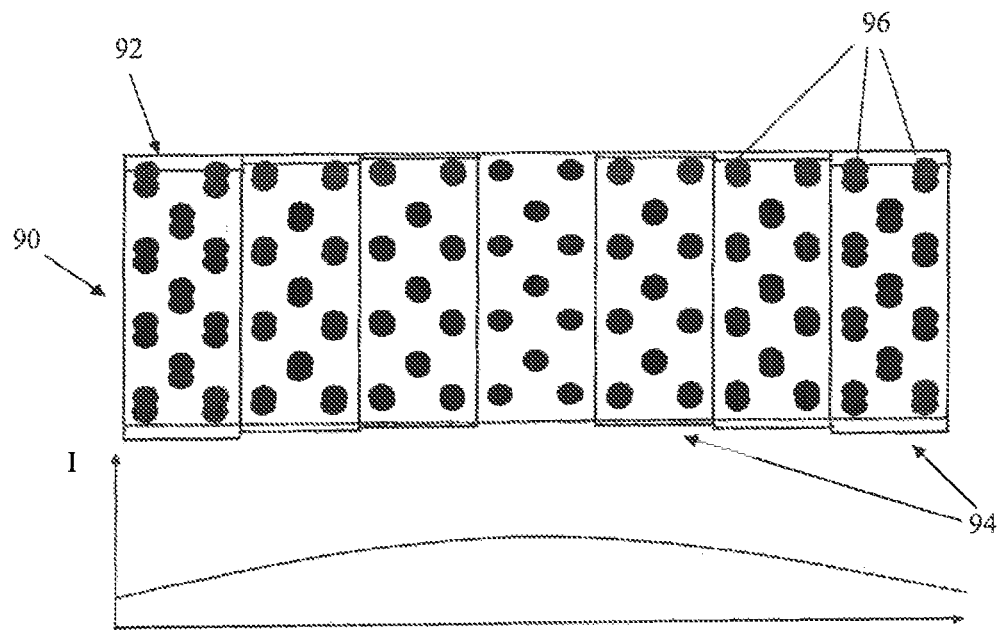
Figure 24:
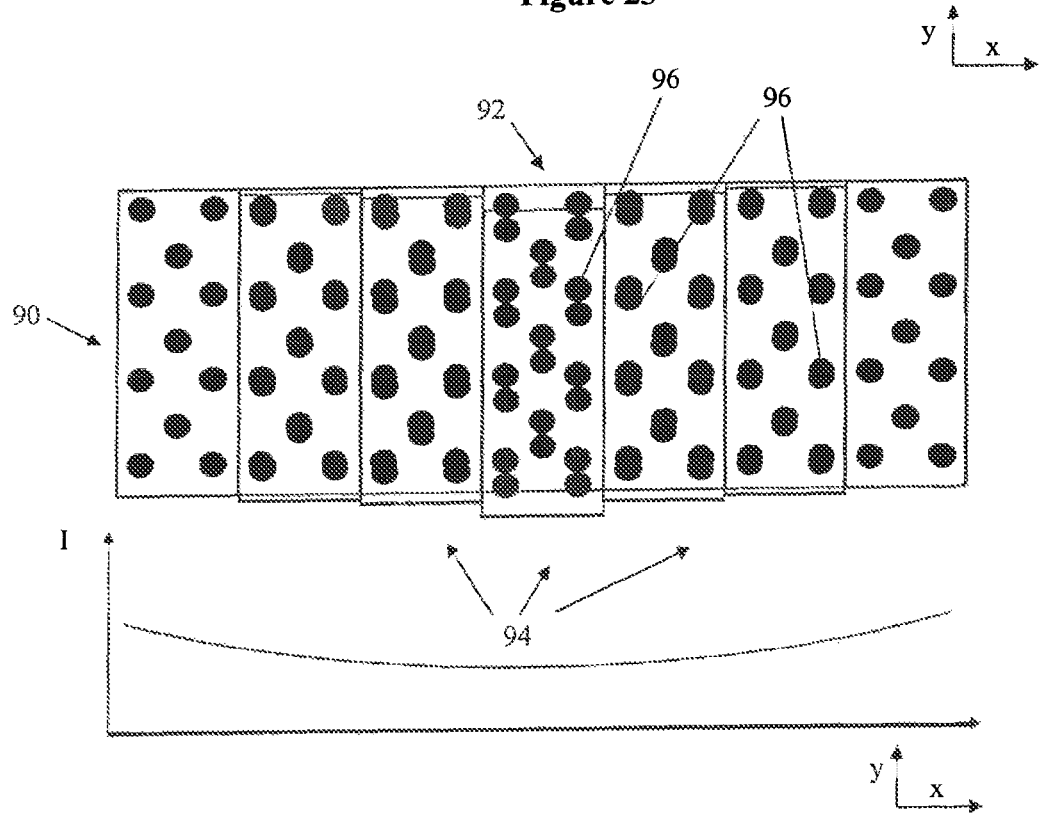

FIGS. 23 and 24 show two different configurations of the radiation intensity filter 90 whereby in each configuration some of the second members 94 have been moved in the y direction relative to the first member 92 such that they are in a second relative position (relative to the first member 92). It will be appreciated that many different second relative positions are possible. In any possible second relative position the total area of overlap in the direction of the optical axis of the opaque regions 96 of the first member 92 with the opaque regions 96 of any of the second members 94 is less than that when the first member 92 and the relevant second member 94 are in the first relative position.

FIGS. 23 and 24 show that by moving each of the second members 94 relative to the first member 92 by different amounts, it is possible to achieve different amounts of overlap between the opaque regions 96 of the first member 92 and the opaque regions of each of the second members 94. The less overlap there is between the opaque regions 96 of the first member 92 and the opaque regions 96 of a particular second member 94, the greater the area of the radiation beam passing through the radiation intensity filter 90 at that point will be blocked by the opaque regions 96 of the first member 92 and the second member 94 combined. Therefore, by moving each of the second members 94 independently relative to the first member 92 so as to define the amount of overlap between the opaque regions 96 of the first member 92 and the opaque regions 96 of each of the second members 94, it is possible to create different profiles (in the x direction) of average radiation intensity which passes through the radiation intensity filter 90.

FIG. 23 shows an example wherein the central second member 94 has been maintained in its first relative position and where the relative displacement of each of the other second members 94 from their respective first relative positions increases from the central second member 94 to the edges of the radiation intensity filter 90. Because the displacement between the first relative position and the second relative of each second member increases as you move from the central second member towards each edge of the radiation intensity filter 90, the amount of overlap between the opaque regions 96 of the first member 92 and each second member 94 decreases as you move from the central second member towards the edges of the radiation intensity filter 90. This results in the profile of the average intensity of radiation transmitted through the radiation intensity filter which is shown in the graph at the bottom of FIG. 23.

FIG. 24 shows the reverse situation to that shown in FIG. 23. In this case, both of the second members 94 which are at an edge of the radiation intensity filter 90 are in their respective first relative positions. However, as you move inwards towards the central second member 94, the displacement between the respective second relative position and first relative position of each second member increases. For the reasons described above, this configuration of the radiation intensity filter 90 produces a profile of average radiation intensity transmitted through the radiation intensity filter 90 which is shown in the graph at the bottom of FIG. 24.

It will be appreciated that any number of second members may be used. The second members may have any appropriate shape. For example, some or all of the second members may have different shapes. Furthermore, it will be appreciated that the second members may be moved individually to form any desired profile of average radiation intensity transmitted through the radiation intensity filter (also referred to as a locally controllably transmission ratio).

Although the embodiments of the radiation intensity filter described above are arranged within the lithographic apparatus such that the optical axis of the beam of radiation which passes through the radiation intensity filter is substantially perpendicular to the plane of the radiation intensity filter, this need not be the case. For example, in some lithographic apparatus, there may be a fixed angle between the optical axis of the radiation beam passing through the radiation intensity filter and the plane of the radiation intensity filter. In some lithographic apparatus, it may be desirable to be able to adjust the angle between the plane of the radiation intensity filter and the optical axis of the radiation beam passing through the radiation intensity filter.

The previously described embodiments of radiation intensity filter are configured such that the first and second members are generally adjacent one another. For instance, the first and second members of the radiation intensity filter may be generally adjacent one another in a direction which is parallel to the optical axis of the radiation beam of the lithographic apparatus which passes through the radiation intensity filter. This need not be the case. For example, the first and second members of the radiation intensity filter may be spaced apart provided the radiation beam of the lithographic apparatus passes through both the first member and the second member. In embodiments where the first and second members are spaced apart, the relative size of the opaque regions of the first and second members may be chosen to compensate for any convergence or divergence of the radiation beam.

Within the embodiments of the radiation intensity filter which are described above, the opaque regions are formed from a material which is opaque to the radiation beam of the lithographic apparatus and are attached to the first and second members. It will be appreciated that the opaque regions may be formed in any appropriate manner. For example, the opaque regions may be formed as a coating of an opaque material which is applied to the first or second members. Alternatively, the opaque regions of at least one of the members may be formed integrally with the rest of the member.

In the above-described embodiments of the radiation intensity filter, the first and second member are formed as plates of a material which is not opaque to the radiation beam of the lithographic apparatus. It will be appreciated that the first and second members may have any appropriate shape and may be formed from any appropriate material which is not opaque to the radiation bean of the lithographic apparatus. Furthermore, it is within the scope of the present invention that the first and second members merely provide support for their respective opaque regions and that the radiation beam need not necessarily pass through the material of the first and second members. For example, the first and second members may be formed as a frame of which the opaque regions form part. The radiation beam may then pass through spaces in the frame of each of the first and second members.

The opaque regions of any of the embodiments described above may have any appropriate size or shape. There may be any appropriate number of opaque regions applied to the first or second members. Any appropriate distribution pattern of opaque regions on the first and second members may be used. A first member and/or a second member may have at least two different types of opaque region, wherein the different types of opaque region have a different shape and/or a different size.

Some of the embodiments referred to above make use of a linear actuator or two similar linear actuators. It will be appreciated that any appropriate type of actuator may be used (for example a rotary actuator). Within an embodiment in which more than one actuator is used to move the first and second members relative to one another, different types of actuator may be used. For example, in order to move a first member relative to a second member two different types of linear actuator may be used, or a linear actuator and a rotary actuator may be used in combination. It will also be appreciated that any appropriate number of actuators may be used in order to move the first and second members relative to one another. In addition, it will be appreciated that any appropriate known type of mechanical linkage may be used to link any actuator to the first and/or second member of a radiation intensity filter according to the present invention.

In some embodiments of the present invention at least one of the opaque regions of first and/or second members may allow some radiation of the lithographic apparatus to pass through it (i.e., allow transmission of some radiation through it), provided that it allows less transmission of the radiation of the lithographic apparatus through it compared to the substantially transparent portion (e.g., plate) of the first and/or second member.

In any of the embodiments described above, it will be appreciated that in order to move a first member and a second member between a first relative position and a second relative position, the first and second members must be moved relative to one another. This relative movement of the first and second members relative to one another may involve holding the first member still while moving the second member, holding the second member still while moving the first member, or moving both the first and the second members. In some embodiments, the first and the second members may be moved by substantially equal amounts in substantially opposite directions.

A radiation intensity filter according to an embodiment of the present invention is preferably polarization-neutral such that it exhibits no polarizing effects, depolarizing effects or birefringence. This is because, in some applications, if the radiation intensity filter polarizes or depolarizes the beam of radiation then the imaging performance of the lithographic apparatus may be adversely affected.

Although the previously described embodiments are such that the opaque regions of the first member and the opaque regions of the second member are on the same side relative to the direction of beam of radiation (i.e., the opaque regions of the first member and the opaque regions of the second member are both either on the side of their respective member which is upstream with respect to the direction of the radiation beam, or on the side of their respective member which is downstream with respect to the direction of the radiation beam), this need not be the case. For example, the opaque regions of the first member may be on the side of the first member which is downstream with respect to the direction of the beam of radiation, whereas the opaque regions of the second member may be on the side of the second member which is upstream with respect to the direction of the radiation beam. In other embodiments the opaque regions of the first and/or second members may be embedded within the first and/or second member.

It will be appreciated by the man skilled in the art that if a radiation intensity filter according to the present invention forms part of a lithographic apparatus in which a uniformity control apparatus is located in a plane which is near to a field plane, then the uniformity control apparatus will affect both the angular intensity distribution of the radiation beam in the field plane as well as the spatial distribution of the radiation beam in the field plane. Because the uniformity control apparatus is located in a field which is near to the field plane, it will affect the spatial distribution of the radiation beam in the field plane to a greater extent than it will affect the angular distribution of the radiation beam in the pupil plane. A radiation intensity filter can be located at any appropriate position within the illuminator, such that the combination of the radiation intensity filter and uniformity control apparatus produce a desired spatial intensity distribution of the radiation beam in the field plane as well as a desired angular intensity distribution in the pupil plane. It will be appreciated that the uniformity control apparatus and radiation intensity filter according to the present invention may be located at any appropriate position within the illuminator such that controlling the angular intensity distribution of the radiation beam at the pupil plane can be controlled separately to the spatial intensity distribution of the radiation beam at the field plane. For example, the uniformity control device may be used to control (or have a grater effect on controlling) the spatial intensity distribution of the radiation beam at the field plane, whereas the radiation intensity filter may be used to control (or have a grater effect on controlling) the angular intensity distribution of the radiation beam at the pupil plane, or vice-versa.

It will be appreciated that using the radiation intensity filter to control the intensity distribution of the radiation beam (whether the angular intensity distribution in the pupil plane, the spatial distribution in the field plane, or a combination of both) may be carried out at any appropriate time. For example, a lithographic apparatus may comprise at least one sensor for detecting the spatial intensity distribution of the radiation beam in the field plane and/or the angular intensity distribution of the radiation beam in the pupil plane. This at least one sensor may provide signals to a control apparatus which actuates the radiation intensity filter so as to control (and therefore modify) the intensity distribution of the radiation beam between substrate exposures, between changing configurations of the patterning device and/or during the exposure of a substrate (e.g., during a scanning process of a lithographic apparatus).

While specific embodiments of the present invention have been described above, it will be appreciated that the present invention may be practiced otherwise than as described. The description is not intended to limit the present invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An illumination system for a lithographic apparatus comprising:
a radiation intensity filter for controlling the intensity distribution of a beam of radiation travelling along an optical axis, the radiation intensity filter comprising:
a first member and a second member, wherein
each of the first and second members comprising a plurality of opaque regions which are substantially opaque to the radiation beam,
the first member and second member are moveable relative to one another between a first relative position and a second relative position,
in the first relative position at least a portion of one of the opaque regions of the first member overlaps in the direction of the optical axis with a portion of one of the opaque regions of the second member, and
in the second relative position the total area of overlap in the direction of the optical axis of the opaque regions of the first member with the opaque regions of the second member is less than that in the first relative position.

2. The illumination system according to claim 1, wherein the first and second members each comprise a plate formed from a material which is not opaque to the radiation beam, and wherein the opaque regions of the first and second members are formed from a material which is opaque to the radiation beam and which is attached to the respective plate.

3. The illumination system according to claim 1, wherein at least one of the opaque regions of the first member and at least one of the opaque regions of the second member are similar.

4. The illumination system according to claim 1, wherein at least one of the opaque regions of the first member is congruent with at least one of the opaque regions of the second member.

5. The illumination system according to claim 1, wherein all of the opaque regions of the first member and/or second member are congruent.

6. The illumination system according to claim 1, wherein at least one of the opaque regions of the first member and/or second member is shaped such that it is non-symmetric with respect to a first axis which is transverse to the direction of relative movement between the first member and the second member.

7. The illumination system according to claim 1, wherein in the first relative position at least one of the opaque regions of the first member completely overlaps a corresponding opaque region of the second member in the direction of the optical axis.

8. The illumination system according to claim 1, wherein in the second relative position none of the opaque regions of the first member overlaps any of the opaque regions of the second member in the direction of the optical axis.

9. The illumination system according to claim 1, wherein the density of the opaque regions of the first and/or second members is substantially constant.

10. The illumination system according to claim 1, wherein the first and/or second members are configured such that the density of their opaque regions is dependent on position along a first axis which is transverse to a scanning direction.

11. The illumination system according to claim 1, wherein the relative movement between the first position and the second position is a linear movement in a direction perpendicular to the optical axis.

12. The illumination system according to claim 11, wherein the relative movement between the first position and the second position is in a direction which is transverse to a scanning direction.

13. The illumination system according to claim 1, wherein the relative movement between the first position and the second position is a relative rotation between the first member and the second member.

14. The illumination system according to claim 13, wherein the relative rotation between the first and second members is about a central portion of each of the first member and the second member.

15. The illumination system according to claim 13, where in the relative rotation between the first and second members is about an edge portion of each of the first member and second member.

16. An illumination system for a lithographic apparatus comprising:
a radiation intensity filter configured to control an intensity distribution of a beam of radiation travelling along an optical axis, the radiation intensity filter comprising a first member and a plurality of second members, wherein:
each of the first and second members comprising a plurality of opaque regions which are substantially opaque to the radiation beam,
each of the second members are independently moveable relative to the first member between a first relative position and a second relative position,
in the first relative position at least a portion of one of the opaque regions of the first member overlaps in the direction of the optical axis with a portion of one of the opaque regions of the second member, and
in the second relative position the total area of overlap in the direction of the optical axis of the opaque regions of the first member with the opaque regions of the second member is less than that in the first relative position.

17. An illumination system for a lithographic apparatus comprising:
a radiation intensity filter configured to control the intensity distribution of a beam of radiation travelling along an optical axis, the radiation intensity filter comprising a first member, a second member and an intermediate member, at least part of which is located between the first member and the second member, wherein:
each of the first, second and intermediate members comprising a plurality of opaque regions which are substantially opaque to the radiation beam,
the intermediate member and the second member are independently moveable relative to the first member and relative to one another between a first configuration and a second and second configuration,
in the first configuration at least a portion of one of the opaque regions of the first member overlaps in the direction of the optical axis with a portion of one of the opaque regions of the second member and/or intermediate member, and/or at least a portion of one of the opaque regions of the intermediate member overlaps in the direction of the optical axis with a portion of one of the opaque regions of the second member, and
in the second configuration the total area of overlap in the direction of the optical axis of the opaque regions of the first member with the opaque regions of the second member and/or intermediate member, and/or of the opaque regions of the intermediate member with the opaque regions of the second member, is less than that in the first relative position.

18. A lithographic apparatus comprising:
an illumination system for providing a beam of radiation along an optical axis;
a support structure for supporting patterning device, the patterning device serving to impart the radiation beam with a pattern in its cross-section;
a substrate table for holding a substrate; and
a projection system for projecting the patterned radiation beam onto a target portion of the substrate,
wherein the illumination system comprises a radiation intensity filter for controlling the intensity distribution of the beam of radiation, the radiation intensity filter comprising a first member and a second member, wherein:
  each of the first and second members comprising a plurality of opaque regions which are substantially opaque to the radiation beam,
  the first member and second member are moveable relative to one another between a first relative position and a second relative position,
  in the first relative position at least a portion of one of the opaque regions of the first member overlaps in the direction of the optical axis with a portion of one of the opaque regions of the second member, and
  in the second relative position the total area of overlap in the direction of the optical axis of the opaque regions of the first member with the opaque regions of the second member is less than that in the first relative position.

19. A method of modifying the intensity distribution of a radiation beam within a lithographic apparatus comprising:
providing a beam of radiation using an illumination system;
providing a radiation intensity filter, the radiation intensity filter comprising a first member and a second member; each of the first and second members comprising a plurality of opaque regions which are substantially opaque to the radiation beam,
passing the beam of radiation through the radiation intensity filter along an optical axis; and
modifying the intensity of the beam of radiation by moving the first member and second member relative to one another between a first relative position and a second relative position, wherein in the first relative position at least a portion of one of the opaque regions of the first member overlaps in the direction of the optical axis with a portion of one of the opaque regions of the second member, and in the second relative position the total area of overlap in the direction of the optical axis of the opaque regions of the first member with the opaque regions of the second member is less than that in the first relative position, thereby the opaque regions of the first and second members blocking a greater proportion of the radiation beam passing through the radiation intensity filter in the second relative position compared to the first relative position.

20. The method of modifying the intensity distribution of a radiation beam within a lithographic apparatus according to claim 19, further comprising:
providing a substrate;
using patterning device to in the radiation beam with a pattern in its cross-section; and
projecting the patterned radiation beam onto a target portion of the substrate.

* * * * *

UNITED STATES PATENT AND TRADEMARK OFFICE
CERTIFICATE OF CORRECTION

| | |
|---|---|
| PATENT NO. | : 8,699,000 B2 |
| APPLICATION NO. | : 13/275733 |
| DATED | : April 15, 2014 |
| INVENTOR(S) | : Winkler et al. |

It is certified that error appears in the above-identified patent and that said Letters Patent is hereby corrected as shown below:

In the Claims

In claim 20, column 30, line 28, delete "in" and insert --impart--

Signed and Sealed this
Second Day of September, 2014

Michelle K. Lee
*Deputy Director of the United States Patent and Trademark Office*